US011182670B2

(12) United States Patent
Hekmatshoartabari

(10) Patent No.: US 11,182,670 B2
(45) Date of Patent: Nov. 23, 2021

(54) THIN-FILM LARGE-AREA CLASSIFIER

(71) Applicant: International Business Machines Corporation, Armonk, NY (US)

(72) Inventor: Bahman Hekmatshoartabari, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 1043 days.

(21) Appl. No.: 15/814,857

(22) Filed: Nov. 16, 2017

(65) Prior Publication Data

US 2019/0147329 A1    May 16, 2019

(51) Int. Cl.
| G06N 3/063 | (2006.01) |
| G06N 3/04 | (2006.01) |
| G06F 3/00 | (2006.01) |
| H03M 3/00 | (2006.01) |

(52) U.S. Cl.
CPC .......... *G06N 3/0635* (2013.01); *G06F 3/002* (2013.01); *G06N 3/04* (2013.01); *H03M 3/406* (2013.01)

(58) Field of Classification Search
CPC .. G06F 3/00; G06F 3/002; G06N 3/04; G06N 3/063; G06N 3/0635; H03M 3/00; H03M 3/406
See application file for complete search history.

(56) References Cited

U.S. PATENT DOCUMENTS 5,212,377 A    5/1993  Karlheinz
5,410,146 A    4/1995  Hur
(Continued)

FOREIGN PATENT DOCUMENTS

WO    2010053894 A1    5/2010

OTHER PUBLICATIONS

Bedell, Stephen W., et al. "Kerf-less removal of Si, Ge, and III-V layers by controlled spalling to enable low-cost PV technologies." IEEE Journal of Photovoltaics 2.2 (2012): 141-147. (Year: 2012).*
(Continued)

*Primary Examiner* — Kamran Afshar
*Assistant Examiner* — Randall K. Baldwin
(74) *Attorney, Agent, or Firm* — L. Jeffrey Kelly

(57) ABSTRACT

A classifier system implementing an equivalent deep neural network (DNN) includes a weight block, classification block, row selector, and sensor array coupled with the weight block, classification block and row selector. The sensor array includes row lines, column lines, a data integration line, an integration start line, and multiple sensor cells corresponding to respective neurons in an input layer of the equivalent DNN. The sensor cells share a common terminal connected to the data integration line, the row lines are controlled by the row selector, and the column lines receive respective weight values from the weight block. The classification block includes a first integrator receiving a signal generated on the data integration line when the integration start line is selected, and a first thresholding unit receiving a signal from the first integrator. The first thresholding unit is coupled to second integrators and second thresholding units arranged in a two-dimensional matrix.

24 Claims, 12 Drawing Sheets

(56) References Cited

U.S. PATENT DOCUMENTS

| | | | |
|---|---|---|---|
| 5,978,025 A * | 11/1999 | Tomasini | H04N 5/353 348/298 |
| 6,066,516 A | 5/2000 | Miyasaka | |
| 7,146,037 B2 | 12/2006 | Shi et al. | |
| 7,224,224 B2 | 5/2007 | Sera et al. | |
| 9,072,887 B2 | 7/2015 | Kagan et al. | |
| 9,646,243 B1 * | 5/2017 | Gokmen | G06N 3/0454 |
| 9,715,656 B1 * | 7/2017 | Gokmen | G06N 3/08 |
| 2003/0135971 A1 * | 7/2003 | Liberman | B01D 67/0058 29/419.1 |
| 2011/0211611 A1 * | 9/2011 | Troccoli | G06K 9/0002 374/45 |
| 2013/0307075 A1 * | 11/2013 | Hekmatshoar-Tabari | H01L 29/78687 257/347 |
| 2015/0206947 A1 * | 7/2015 | Hekmatshoartabari | H01L 29/8126 257/66 |
| 2016/0247043 A1 | 8/2016 | Warren | |
| 2017/0061281 A1 * | 3/2017 | Gokmen | G06N 3/084 |
| 2017/0109628 A1 * | 4/2017 | Gokmen | G06N 3/0635 |
| 2017/0117236 A1 * | 4/2017 | Afzali-Ardakani | H01L 31/022408 |
| 2017/0125607 A1 * | 5/2017 | Hekmatshoartabari | H01L 21/283 |
| 2018/0018559 A1 * | 1/2018 | Yakopcic | G06F 17/10 |
| 2018/0293493 A1 * | 10/2018 | Kalamkar | G06T 1/20 |
| 2018/0364785 A1 * | 12/2018 | Hu | G06K 9/00208 |
| 2019/0035154 A1 * | 1/2019 | Liu | G06K 9/00208 |

OTHER PUBLICATIONS

Yakopcic, Chris, Raqibul Hasan, and Tarek M. Taha. "Memristor based neuromorphic circuit for ex-situ training of multi-layer neural network algorithms." 2015 International Joint Conference on Neural Networks (IJCNN). IEEE, 2015: 1-7. (Year: 2015).*

Gokmen, Tayfun, and Yurii Vlasov. "Acceleration of deep neural network training with resistive cross-point devices: Design considerations." Frontiers in neuroscience 10 (2016): 333, pp. 1-13. (Year: 2016).*

Cantley et al., "Neural Learning Circuits Utilizing Nano-Crystalline Silicon Transistors and Memristors," IEEE Trans. on Neural Networks and Learning Systems, vol. 23, No. 4, Apr. 2012.

Balsi et al., "Optoelectronic Cellular Neural Network Based on Amorphous Silicon Thin Film Technology", Proceedings of Third IEEE International Workshop on Cellular Neural Networks and their Applications (CNNA-94), Rome, Italy, Dec. 18-21, 1994, IEEE cat. No. 94TH0693-2, ISBN 0-7803-2070-0, pp. 1-5.

Collobert et al., "Dedicated neural network A retina for edge detection", NATO ASI Series, vol. F 68, Neurocomputing, © Springer-Verlag Berlin Heidelberg 1990, 7 pages.

Dhanalakshmi et al., "Digital Gas Identification System Using Artificial Neural Networks", Research & Reviews, International Journal of Advanced Research in Electrical, Electronics and Instrumentation Engineering, vol. 3, Issue 4, Apr. 2014, 7 pages.

Galup-Montoro et al., "Series-parallel association of FET's for high gain and high frequency applications", Published in: IEEE Journal of Solid-State Circuits ( vol. 29 , Issue: 9, Sep. 1994), 2 pages.

Koga et al., "Neural Network using FPGA for Neurons and IGZO Thin Films for Synapses", AM-FPD '16, pp. 179-180.

Li et al., "Pattern Recognition by an Optical Thin-Film Multilayer Model", Published: Feb. 1999, Annals of Mathematics and Artificial Intelligence, 26, 193-213(1999), 23 pages.

Moy et al., "A Thin-Film, Large-Area Sensing and Compression System for Image Detection", IEEE Transactions on Circuits and Systems—I: Regular Papers, vol. 63, No. 11, Nov. 2016, pp. 1833-1844.

Rieutort-Louis et al., "A Large-Area Image Sensing and Detection System Based on Embedded Thin-Film Classifiers", IEEE Journal of Solid-State Circuits, vol. 51, No. 1, Jan. 2016, pp. 281-290.

Riggio et al., "Polymeric thin film technology for neural interfaces: Review and perspectives", (2010). Polymer Thin Films, 21 pages.

Yamaguchi et al., "Artificial Neural Network using Thin-Film Transistors—Working Confirmation of Asymmetric Circuit—", ©2013 IEEE, 2 pages.

* cited by examiner

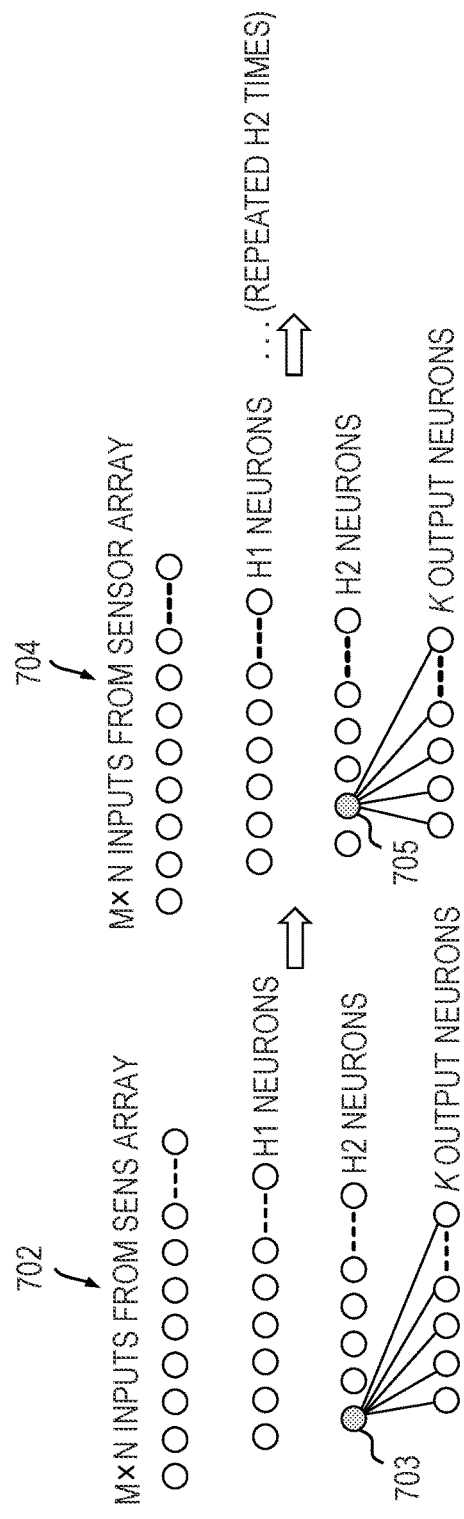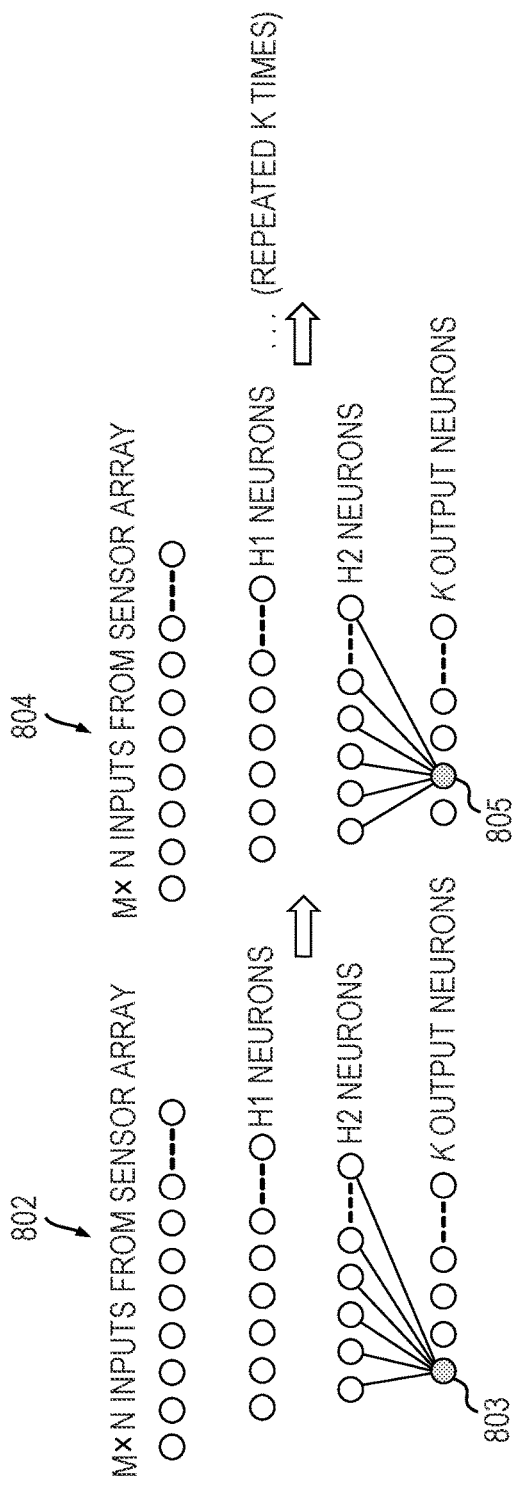

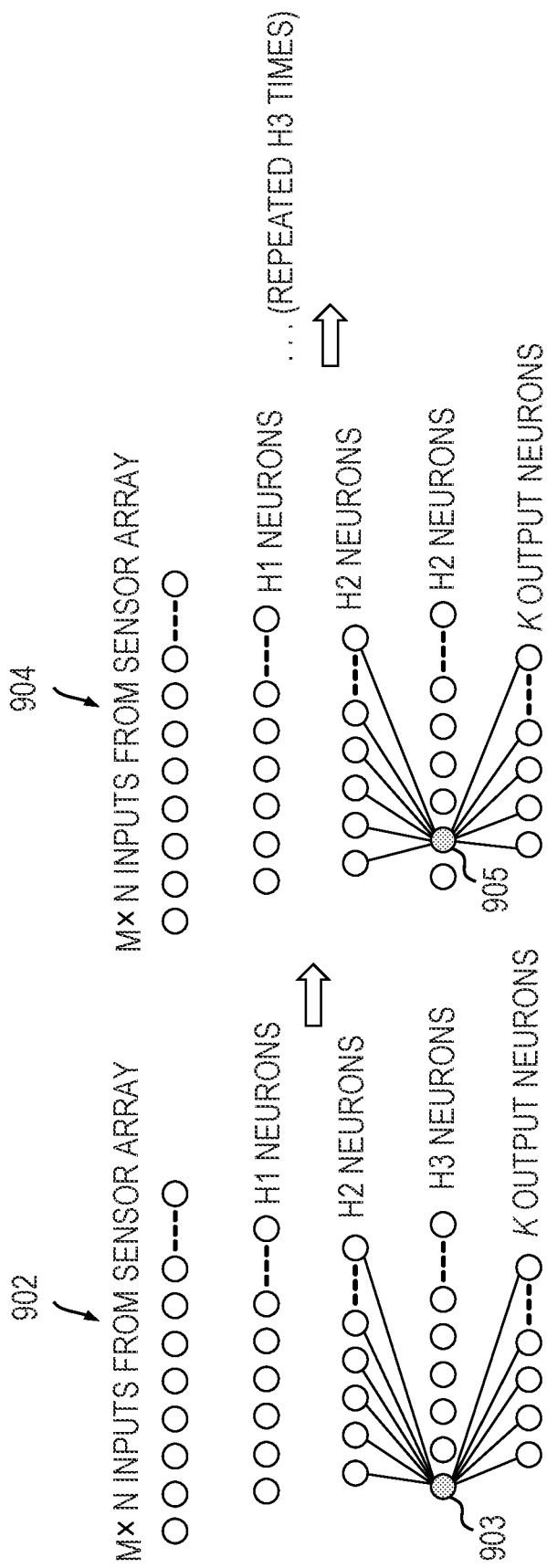

THIN-FILM LARGE-AREA CLASSIFIER

BACKGROUND

The present invention relates generally to the electrical, electronic and computer arts, and, more particularly, to deep neural network circuitry.

In the context of a statistical-classification problem with two classes, a decision boundary or decision surface partitions an underlying vector space into two sets; one set for each class. A classifier will classify all data points on one side of the decision boundary as belonging to one class and all those data points on the other side as belonging to the other class. The decision boundary is the region of a problem space in which the output label of the classifier is ambiguous.

If the decision surface is a hyperplane, then the classification problem is linear, and the classes are linearly separable. Decision boundaries, however, are not always well-defined; that is, the transition from one class in the feature space to another class is not discontinuous, but is gradual. This effect is common in fuzzy logic based classification algorithms, where membership in one class or another is unclear.

From a hardware perspective, neural networks and other sophisticated classifiers may be implemented using very large scale integration ($V_LSI$) complementary metal-oxide-semiconductor (CMOS) devices. However, such implementations are not feasible for thin-film transistors (TFTs) due to their low performance and lack (or feasibility) of complementary transistors, among other disadvantages. Implementations using TFTs have thus been typically limited to linear decision boundaries or a combination of linear decision boundaries.

SUMMARY

Aspects according to one or more embodiments of the present invention relate to a novel thin-film classifier architecture which achieves superior performance compared to conventional thin-film classifiers, and which is particularly well-suited for neural network applications. Embodiments of the invention exploit the higher performance of thin-film heterojunction field-effect transistor (HJFET) devices compared to conventional TFTs such as amorphous silicon.

In accordance with an embodiment of the invention, an exemplary classifier system for implementing an equivalent deep neural network (DNN) includes a weight block, a classification block, a row selector and a sensor array operatively coupled with the weight block, the classification block and the row selector. The sensor array includes a plurality of sensor cells corresponding to respective neurons in an input layer of the equivalent DNN, the sensor cells being arranged in a two-dimensional matrix configuration, row lines, column lines, a data integration line and an integration start line.

The classifier system is configured such that the sensor cells share a common terminal connected to the data integration line, the row lines are controlled by the row selector, and the column lines receive respective weight values from the weight block, the weight values received from the weight block corresponding to connection weights in the equivalent DNN.

The classification block includes a first integrator receiving a signal generated on the data integration line when the integration start line is selected, and a first thresholding unit receiving a signal from the first integrator, the first thresholding unit operatively coupled to an array of second integrators and second thresholding units arranged in a two-dimensional matrix configuration. The array of second integrators and second thresholding units include row lines, controlled by the row selector, and column lines adapted to receive respective weight values from the weight block.

In accordance with another embodiment, a method of classifying data acquired from a sensor array includes: providing a classifier system implementing an equivalent deep neural network (DNN), the classifier system including a weight block, a classification block, a row selector, and the sensor array operatively coupled with the weight block, the classification block and the row selector, the sensor array comprising row lines, column lines, a data integration line, an integration start line and a plurality of sensor cells corresponding to respective neurons in an input layer of the equivalent DNN, the sensor cells arranged in a two-dimensional matrix configuration, the classification block comprising at least a first integrator coupled to a first thresholding unit, a classification array arranged in a two dimensional matrix of second integrators coupled to corresponding second thresholding units, row lines and column lines; resetting the second integrators in the classification block; resetting a first integrator in the classification block; scanning the sensor array sequentially by selecting a given one of the row lines of the classification array and loading prescribed voltages provided by the column lines onto storage capacitors included in the respective sensor cells coupled to the given one of the row lines, the prescribed voltages corresponding to connection weights associated with the neurons in the input layer of the equivalent DNN; generating a weighted sum of sensor readings obtained from scanning the sensor array by connecting the sensor array to the first integrator; thresholding the weighted sum of the sensor readings by applying an activation function using the first thresholding unit; multiplying the thresholded weighted sum of the sensor readings with the prescribed voltages corresponding to connection weights provided by the column lines using the second integrators in the selected given one of the row lines of the classification array, the prescribed voltages corresponding to connection weights between neurons in a first hidden layer and neurons in one of a next hidden layer and an output layer of the equivalent DNN; generating a cumulative weighted sum of the thresholded weighted sums of the sensor readings by repeating the steps of resetting a first integrator, sequentially scanning the sensor array, generating the weighted sum of sensor readings, thresholding the weighted sum of the sensor readings and multiplying the thresholded weighted sum of the sensor readings for H1 cycles using the second integrators in each column of the selected given one of the row lines of the classification array, H1 being a number of neurons in the first hidden layer of the equivalent DNN; and generating an output by applying the cumulative weighted sum to the second thresholding units in the corresponding columns of the selected given one of the row lines of the classification array, or generating corresponding inputs for the second integrators in a next subsequent row of the classification array.

Techniques as disclosed herein can provide substantial beneficial technical effects. By way of example only and without limitation, one or more embodiments may provide one or more of the following advantages:

leverages the higher performance of thin-film HJFET devices;

enables complex decision boundaries and accurate classification based on deep neural networks;

enables use of large-area and flexible substrates for high-performance classifiers.

These and other features and advantages will become apparent from the following detailed description of illustrative embodiments thereof, which is to be read in connection with the accompanying drawings.

BRIEF DESCRIPTION OF THE DRAWINGS

The following drawings are presented by way of example only and without limitation, wherein like reference numerals (when used) indicate corresponding elements throughout the several views, and wherein:

FIGS. 6 and 7 conceptually depict an exemplary method of operation of the illustrative classification block shown in FIG. 5, according to an embodiment of the present invention;

FIG. 8 conceptually depicts an exemplary method of operation of the illustrative classification block shown in FIG. 5, according to an alternative embodiment of the invention;

FIG. 9 conceptually depicts at least a portion of an exemplary method for implementing a third hidden layer of a classification block, according to an embodiment of the present invention;

It is to be appreciated that elements in the figures are illustrated for simplicity and clarity. Common but well-understood elements that may be useful or necessary in a commercially feasible embodiment may not be shown in order to facilitate a less hindered view of the illustrated embodiments.

DETAILED DESCRIPTION

Principles of the present disclosure will be described herein in the context of illustrative classification blocks or modules and related circuitry for use in a classifier system based on a deep neural network (DNN) for enhancing the performance of the system. It is to be appreciated, however, that the specific systems, circuits and/or methods illustratively shown and described herein are to be considered exemplary as opposed to limiting. Moreover, it will become apparent to those skilled in the art given the teachings herein that numerous modifications can be made to the embodiments shown that are within the scope of the appended claims. That is, no limitations with respect to the embodiments shown and described herein are intended or should be inferred.

Figure 1:
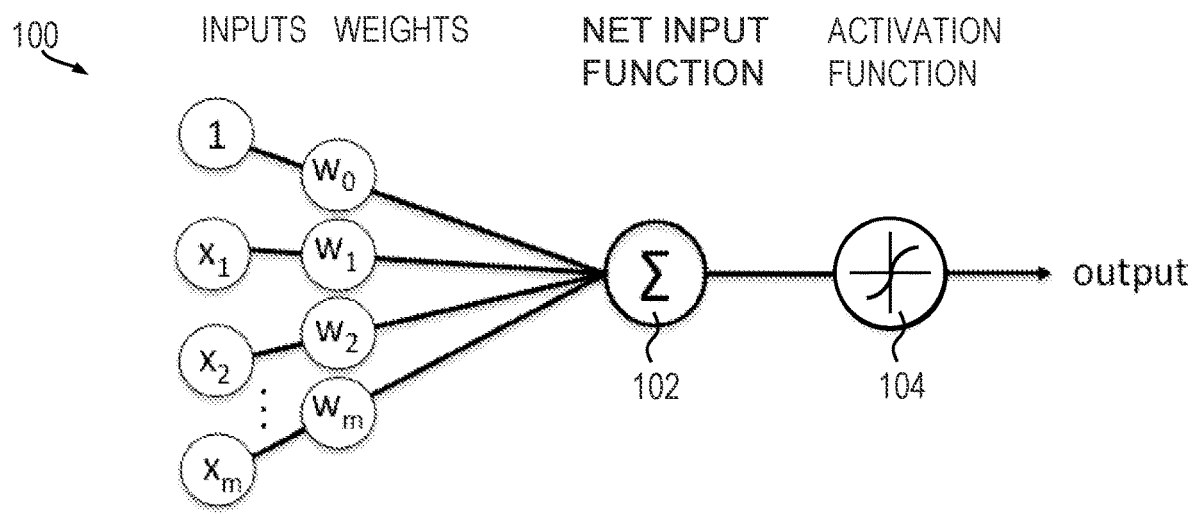
FIGS. 1 and 2 are conceptual views depicting at least a portion of an illustrative neural network in which aspects of the present invention may be employed.
Figure 2:
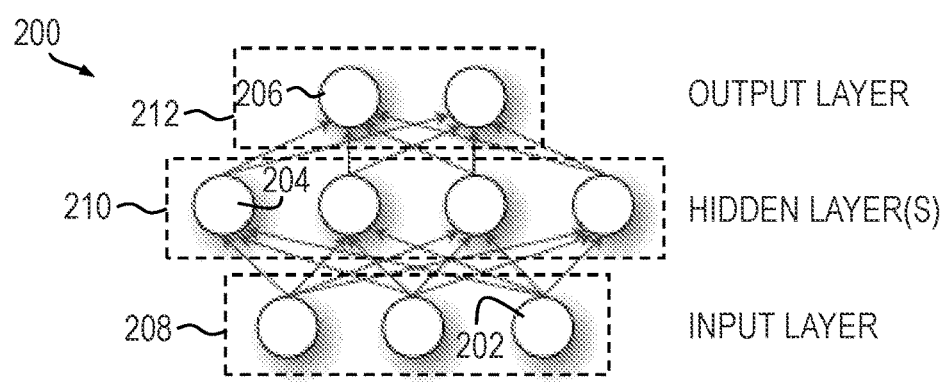

FIGS. 1 and 2 are conceptual views depicting at least a portion of an illustrative neural network with which aspects of the present invention may be employed. With reference to FIG. 1, an exemplary node 100 of a DNN is shown. The node 100 combines one or more inputs $(1, x_1, x_2, \ldots x_m)$ from data with a set of corresponding coefficients, or weights $(w_0, w_1, w_2, \ldots w_m)$, and the weighted inputs are summed by a net input function 102. An output generated by the net input function 102 is then passed through an activation function 104 (also known as a transfer function). The activation function serves as a threshold, determining whether and to what extent that signal progresses further through the network to affect the ultimate outcome, say, an act of classification.

An overall DNN 200 can be modeled as a plurality of nodes, 202, 204 and 206, organized into hierarchical layers, namely, an input layer 208, one or more hidden layers 210, and an output layer 212, as shown in FIG. 2. The hidden layers 210 may be arranged hierarchically. The more hidden layers 210 that a given neural network includes, the deeper the network.

As previously stated, neural networks and other sophisticated classifier systems, such as, for example, support vector machines and machine learning algorithms, may be implemented in complementary metal-oxide-semiconductor (CMOS) technology using very large scale integration ($V_LSI$) devices. Such classifier systems may include, for example, amplifiers, bias generators, derivative generators, multipliers, etc. However, such implementations are not feasible for thin-film transistors (TFTs) due to their low performance and lack (or feasibility) of complementary transistors, among other disadvantages. Furthermore, such implementations are too complex for large-area and flexible electronics. Consequently, implementations using TFTs have thus far been restricted to linear decision boundaries or a combination of linear decision boundaries.

Aspects according to one or more embodiments of the invention provide a novel thin-film classifier architecture which achieves superior performance compared to conventional thin-film classifiers, and which is particularly well-suited for neural network and other sophisticated classifier applications. Embodiments of the invention exploit the higher performance of thin-film heterojunction field-effect transistor (HJFET) devices compared to conventional TFTs such as amorphous silicon (Si) devices. While training is still performed offline, the thin-film classifier according to aspects of the invention can enable complex decision boundaries and accurate classification based on deep neural networks (there is no fundamental limit on the number of hidden layers used in the novel implementation). Some possible applications include, but are not limited to, image classification (e.g., hand-written text), classification of biosensory data (e.g., epileptic vs. normal from the brain surface) and structural health monitoring (e.g., using pressure sensors).

Figure 3:
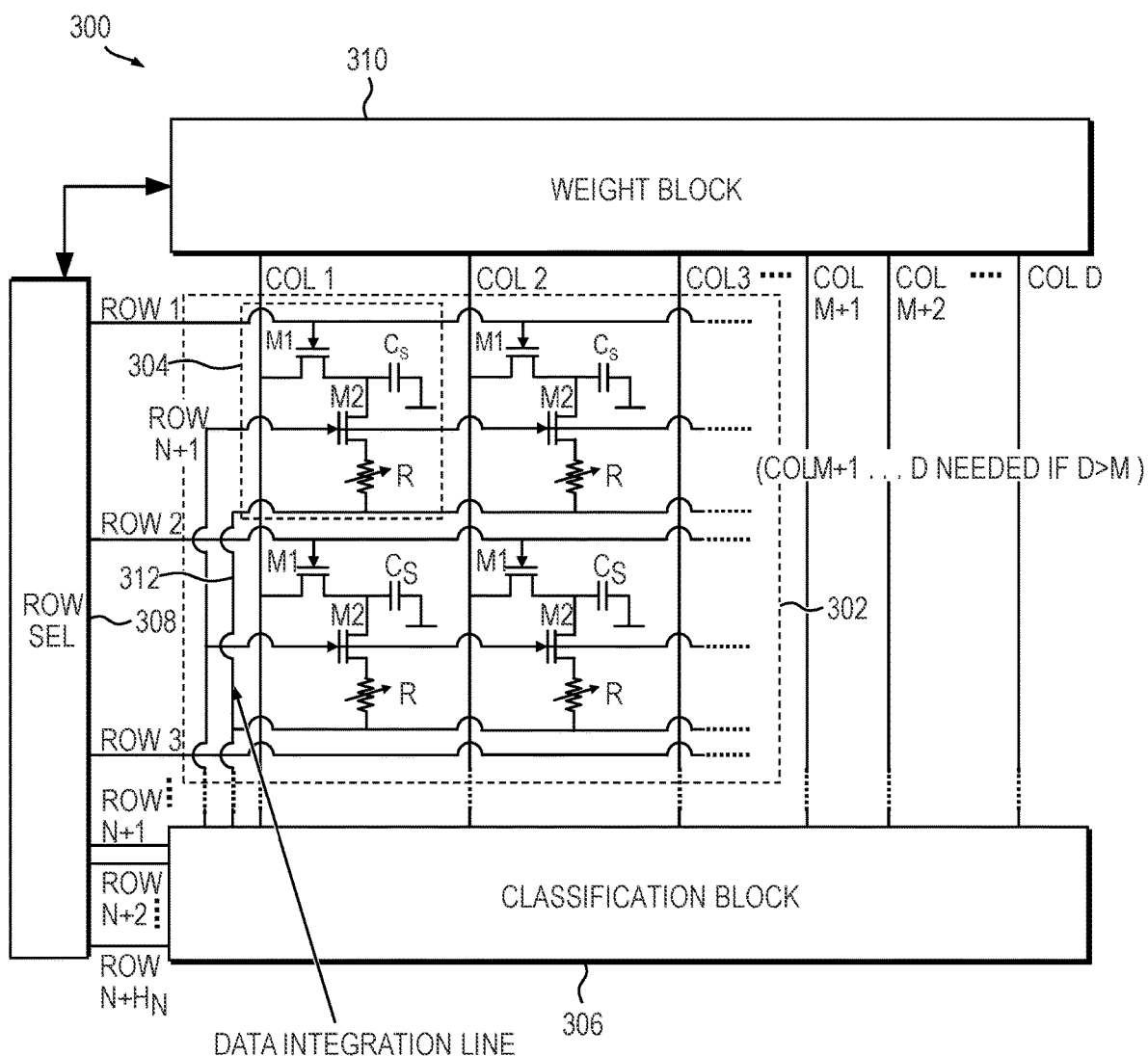
FIG. 3 is a block diagram depicting at least a portion of an exemplary classifier system 300 in which aspects of the present invention are implemented, according to an embodiment of the present invention.

FIG. 3 is a block diagram depicting at least a portion of an exemplary classifier system 300 in which aspects of the present invention are implemented, according to an embodiment of the invention. The system 300, in this embodiment, includes a sensor array 302 comprising a plurality of individual sensor cells 304 arranged in a two-dimensional matrix configuration (i.e., columns and rows), a classification block or module 306 operatively coupled with the sensor array, a row selector (Row Sel) 308 operatively coupled with the sensor array, and a weight block or module 310 operatively coupled with the sensor array and classification block 306. The sensor cells 304 in the sensor array 302 are coupled to corresponding row lines (Row 1, Row 2, . . . , Row N) and column lines (Col 1, Col 2, Col 3, . . . Col M), where N and M are integers, with each cell being selectively accessed using signals conveyed by a unique pair of a corresponding row line and column line. The sensor array further includes an integration start line, Row N+1, and a data integration line 312, which are shared between all the sensor cells. The data integration line 312 connects the sensor array 302 to an integrator unit in the classification block 306. The classifier system 300, in one or more embodiments, includes additional row lines, Row N+2, Row N+3 . . . Row N+H$_N$ and, in one or more other embodiments, additional column lines, Col M+1, Col M+2, . . . Col D, which are associated with the operation of the hidden and output blocks, which will be discussed in further detail herein below with reference to FIGS. 4 and 5.

Each of the sensor cells 304 in the sensor array 302 includes a first transistor, M1, which may be a field-effect transistor (FET), and a storage capacitor, $C_S$, coupled with M1. Specifically, a first source/drain of transistor M1 in the sensor cell 304 is connected with a corresponding column line, such as Col 1 (which is shared between all the N sensor cells in that column), a second source/drain of M1 is connected with a first terminal of the storage capacitor $C_S$, a second terminal of $C_S$ is connected with a first voltage supply, which may be VSS or ground, and a gate of M1 is connected with a corresponding row line, such as Row 1 (which is shared between all the M sensor cells in that row). The sensor cell 304 further includes a second transistor, M2, and a sensor device which is represented, at least in part, by a variable resistor, R. A first source/drain of transistor M2 is connected to the first terminal of the storage capacitor $C_S$ and the second source/drain of transistor M1, a second source/drain of M2 is connected to the first terminal of the variable resistor R (i.e., the sensor device), a gate of M2 is connected to the integration start line, Row N+1 (which is shared between all the M×N sensor cells), and a second terminal of the variable resistor R (the sensor device) is connected to the data integration line 312 (which is shared between all the M×N sensor cells). In one or more preferred embodiments, the transistors M1 and M2 used in the sensor array, as well as the transistors used in the other blocks of the classifier system, particularly the classification block, are heterojunction field-effect transistors.

As previously stated, the variable resistor R represents at least a portion of a sensor device. In one exemplary application wherein the classifier system 300 is used for image classification, the sensor device is a two-terminal element comprised of a photoconductive material such as hydrogenated amorphous silicon or other chalcogenides. When an image is projected over the sensor array, the sensor devices in different pixels are exposed to different illumination levels and therefore exhibit different R values; the higher the illumination level, the higher the photoconduction and therefore the lower the R value. In the case of monochrome (e.g., grayscale) images, the same sensor devices may be used in all pixels. In the case of color images, different sensors (or the same sensors with different color filters) may be used for each of the principal colors (e.g. red, green and blue); for instance, in each of three adjacent pixels.

In another exemplary application wherein the classifier system 300 is used for the classification of mechanical strain distribution patterns over a surface, the sensor device is preferably a two-terminal element comprised of a piezo-resistive material. The spatial distribution of mechanical strain results in different strain levels applied to different sensors thus resulting in different R values in the pixels. In another example where the classifier system 300 is used for the classification of thermal distribution patterns over a surface, the sensor device is preferably a two-terminal element comprised of a thermo-electric material. The spatial distribution of temperature results in different temperature levels and thus different R values in different pixels.

In one or more other embodiments, each of at least a subset of the sensor devices may include additional terminals (not explicitly shown in the equivalent circuit of FIG. 3, but implied) for performing sensing and/or controlling functions. In one exemplary application wherein the classification system 300 is used for the classification of the distribution patterns of chemical and/or biological species over a surface, the sensor devices are preferably three-terminal ion-sensitive field-effect transistors, where the variable resistor represents the channel resistance of the ion-sensitive field-effect transistor (i.e., the two terminals of the variable resistor represent the source and the drain terminals) and the gate terminal (not shown), which may by functionalized, is used for sensing and/or interfacing with the measurement surface (e.g., of a chemical medium or a biological tissue). The ion-sensitive field-effect transistor may further include a back-gate (also not explicitly shown, but implied) for bias control. Similar to the classification of colored images, the sensor array may include different bio/chemical sensor devices (or functionalization layers) if classification requires sensing more than one biological and/or chemical species.

In another exemplary application, wherein thermal distribution and strain distribution data are both necessary for classification, the sensor array may include both thermo-electric and piezo-resistive sensors. For instance, of every two adjacent pixels, one may contain a thermo-electric sensor and the other may contain a piezo-resistive sensor. It will be appreciated by those skilled in the art that the different sensors used in the array may not be of equal numbers. For instance, a smaller number of temperature sensors than strain sensors (e.g., one in every four adjacent pixels) may be used in one or more of the following situations: thermal distribution data are less important to decision making than the strain distribution data; available temperature sensors produce a stronger response (because of higher sensitivity and/or stronger input signal) than the available strain sensors; the thermal gradients are smaller than the strain gradients in the medium of interest.

The number of pixels in the sensor array corresponds to the number of neurons, m, in the input layer of an equivalent neural network (as denoted in the exemplary neural network of FIG. 1); that is, m=M×N, where M is the number of columns and N is the number of rows in the sensor array, as illustrated in FIG. 3. Note, in the exemplary neural network of FIG. 2, m=3, which may correspond to either M=1, N=3; or M=3, N=1. In one or more preferred embodiments, however, a larger number of rows and columns are used. Choosing M≥N may reduce the classification time by enabling the parallel loading of a larger number of weights, as will become apparent from the description of the sensor array operation.

If the number of neurons in any of the hidden layers or the output layer of the equivalent neural network is larger than the number of columns M in the sensor array, the classifier system may include additional columns; for example, a total of D columns, where D is the largest number of neurons in any of the hidden layers and the output layer of the equivalent neural network. For example, if M=10, H1=15 (H1 representing the number of neurons in the first hidden layer), H2=12 (H2 representing the number of neurons in the second hidden layer) and K=8 (K representing the number of neurons in the output layer), then D=15 and 5 column lines are required in addition to the 10 column lines used for the sensor array. In another example, where M=10, H1=8, H2=5 and K=5, no additional column lines are required.

In the exemplary classifier system 300 of FIG. 3, the weight block 310 and at least a portion of the column lines used for transferring the weight values to the sensor array 302 are also used for providing weight values to the classification block 306. However, it will be appreciated that, in some embodiments, a separate weight block and associated column lines may be used for the classification block. Sharing the weight block and column lines between the sensor array 302 and the classification block is beneficial in reducing the hardware and may result in a smaller system footprint, but it does now allow a next data acquisition cycle to start while a current classification operation is in progress. By contrast, using separate weight blocks and column lines increases the hardware and may result in a larger system footprint, but it may allow simultaneous operation of at least a portion of a subsequent data acquisition cycle while a current classification operation is in progress. The above aspects of the classifier system will become further clear with the following description of the classifier system operation.

During a data acquisition operation of the sensor array, e.g., while an image is being projected over an image sensor array, all M2 transistors are disabled (i.e., turned off) by assertion of an appropriate voltage (e.g., a logical low) on the integration start line, row N+1, and the M1 transistors are enabled (i.e., turned on) row-by-row, by assertion of an appropriate voltage (e.g., a logical high) on row lines 1 through N, sequentially (i.e., one row at a time). With transistor M1 turned on, a prescribed voltage placed by the weight block 310 on the corresponding column line is passed through M1 and applied across the storage capacitor $C_S$, which retains the applied voltage even after the transistor M1 is disabled (i.e., turned off); once M1 is turned off, the first terminal of the storage capacitor $C_S$ effectively becomes a floating node. Next, the M2 transistors are enabled (while the M1 transistors are disabled) for data transfer to the classification block 306 via the data integration line 312. This procedure is repeated, sequentially, H1 times, where H1 is the number of neurons in the first hidden layer of the equivalent neural network.

More specifically, referring to sensor cell 304, when row 1 is selected, the M1 transistor in cell 304 is turned on, and the voltage placed on Col 1 is stored across $C_S$ in cell 304. Since the M1 transistors in the rest of the cells in the first row are also selected, the voltages placed on Col 2 through M are also stored across the $C_S$ capacitors in the corresponding cells in the first row. Next, row 1 is deselected, new voltages are placed on the column lines by the weight block 310, row 2 is selected, and the voltages placed on the column lines are stored across the cells in the second row. Once the entire sensor array 302 has been scanned in this manner, i.e., by sequential selection of rows 1 through N, and loading the voltages placed on columns 1 through M, a total of m=M×N voltages have been loaded from the weight block 310 across the $C_S$ capacitors.

As will be discussed further below, the voltages provided by the column lines and stored across the storage capacitors are proportional (linearly, to the first order) to the weights associated with the connections between the neurons in the input layer and the neurons in the first hidden layer of the equivalent neural network. Therefore, the column line voltages may be referred to as weight voltages. The m=M×N weight voltages loaded on the sensor array 302 after a single scan of the array correspond to the weights associated with the connections between the input layer and a single neuron in the first hidden layer of the equivalent neural network. Since there are H1 neurons in the first hidden layer of the equivalent neural network, the sensor array is scanned H1 times to load all the M×N×H1 weights associated with the connections between the m=M×N neurons in the input layer and the H1 neurons in the first hidden layer of the equivalent neural network. Once each scan is finished, the integration start line, row N+1, is selected to turn on the M2 transistors (while the M1 transistors are off) and transfer the "weighted sum" of the acquired sensor data to the classification block 306 for processing, via the data integration line 312, as will be discussed below. Therefore, during each data acquisition cycle, rows 1 through N+1 are scanned sequentially, H1 times.

It will be appreciated that, in some embodiments, the M2 transistors may be replaced with a single transistor connected between the sensor array 302 and the classification block 306 (e.g., transistor $M2_{eq}$ illustrated in the equivalent circuit of FIG. 10, described in further detail herein below). However, the required channel width to channel length ratio (W/L) of the single transistor (e.g., $M2_{eq}$) may be prohibitively large, particularly when a large number of sensor arrays is used and/or if short integration times are desired for fast classification.

As known in the art, appropriate high and low logic levels depend on the type and parameters of the transistors being used. For example, for an n-channel conventional thin-film transistor (which is, in principle, a metal-oxide field-effect transistor, or MOSFET), the logical high is chosen sufficiently above the threshold voltage of the transistor and therefore is typically a sufficiently large positive voltage, e.g., $V_{DD}$; whereas the logical low is chosen sufficiently below the threshold voltage, and therefore is typically close to zero (e.g., ground) or negative. For an n-channel HJFET, the logical high is chosen sufficiently above the pinch-off voltage, e.g., close to zero; whereas the logical low is chosen sufficiently below the pinch-off voltage and therefore is typically a sufficiently large negative voltage, e.g., $V_{SS}$. Note, the pinch-off voltage of an n-channel HJFET has a negative value, whereas the pinch-off voltage of a p-channel HJFET has a positive value. When n-channel MOS transistors or n-channel HJFETs are used, row lines are selected by asserting logical high voltages and deselected by applying logical low voltages. Conversely, when p-channel transistors are used, row lines are selected by asserting logical low voltages and deselected by applying logical high voltages. The exemplary embodiments described herein use n-channel transistors; however, it will become apparent to those skilled in the art given the teachings herein that these embodiments can be similarly implemented using p-channel transistors.

Due to the sequential operation of the sensor array as described above, transistors with high switching speeds are desired to reduce the data acquisition time. In addition, transistors with sufficiently low off-currents are required to avoid substantial discharge of the $C_S$ storage capacitors during the scan of the sensor array. Moreover, transistors with low operation voltages are desired to reduce the system-level power consumption. The requirements described above are also applicable to the operation of the classification block, which will be described in further detail herein below. Conventional thin-film transistors used in large-area electronics and displays may not (at least not satisfactorily) meet one or more of the above requirements. On the other hand, high-performance conventional transistors used in modern semiconductor chips are generally not compatible with large-area and flexible substrates. HJFET devices, however, are compatible with large-area and flexible substrates, and surpass the device performance of conventional thin-film transistors. Therefore, in one or more preferred embodiments, HJFET devices are used for the implementation of the sensor array 302 and the classification block 306. HJFET devices may also be used in the implementation of the row selector 308 and/or the weight block 310, in one or more embodiments.

In a preferred embodiment, the weights are provided to the sensor array 302 as weight voltages, $V_{ij}$ (where $1 \le i \le M$ and $1 \le j \le N$; i and j are integers), by the weight block 310, as illustrated in FIG. 3. Therefore, when a new weight voltage is applied to a given storage capacitor $C_S$, depending on the voltage already present across $C_S$ (either a residual/stray voltage, or a previously-loaded weight voltage), $C_S$ is either charged or discharged to the new weight voltage, and generally no additional reset circuitry is required to reset the pre-existing voltage on $C_S$. In one or more other embodiments, the weights may be provided to the sensor array 302 as weight currents, $I_{ij}$ (where $1 \le i \le M$ and $1 \le j \le N$; i and j are integers), by the weight block 310. In such embodiments, the weight voltages stored across $C_S$ may be expressed as $V_{ij} = V_{ij,0} + I_{ij} \times t_{select}/C_S$, where $t_{select}$ is the time period during which transistor M1 is turned on, and $V_{ij,0}$ is the pre-existing voltage. Therefore, for proper operation, $V_{ij,0}$ may be reset to zero prior to each scan, for instance by using a reset transistor $M_S$ (not explicitly shown, but implied) added in parallel with $C_S$; i.e., a drain of $M_S$ connected to one terminal of $C_S$, a source of $M_S$ connected to the other terminal of $C_S$, and a gate of $M_S$ connected to a reset line, e.g. Row 0 (not shown), which is shared between all $M_S$ transistors, and selected before row 1 (i.e., prior to each scan).

Figure 4:
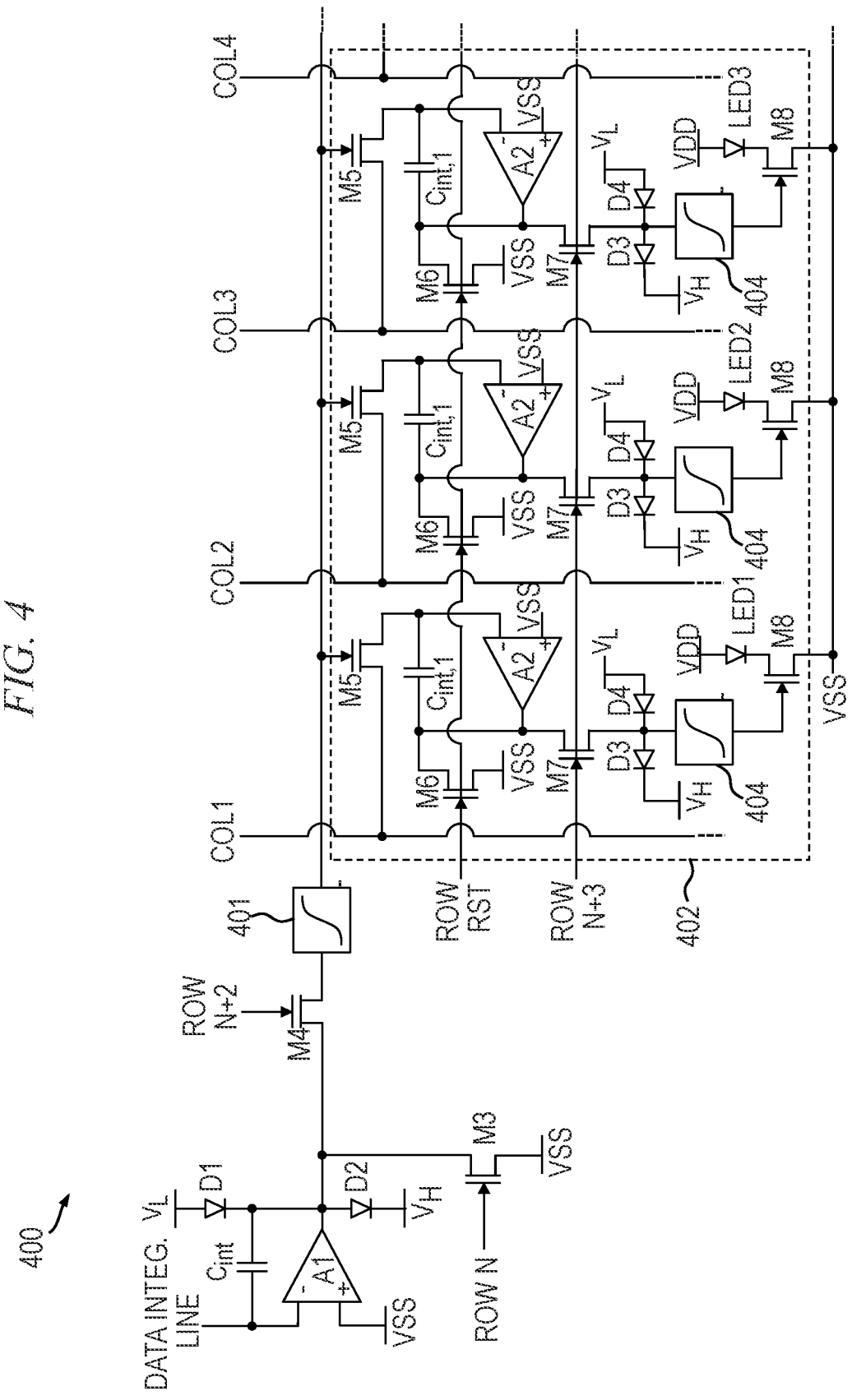
FIG. 4 is an electrical schematic diagram depicting at least a portion of an exemplary classification block corresponding to a neural network having one hidden layer, according to an embodiment of the present invention.

By way of example only and without limitation, FIG. 4 is an electrical schematic diagram depicting at least a portion of an exemplary classification block or module 400, which corresponds to an equivalent neural network with one hidden layer, according to an embodiment of the invention. The classification block 400 is an illustrative implementation of the classification block 306 shown in FIG. 3. The classification block 400 includes row selection circuitry comprising a first amplifier, A1, which may be implemented as an operational amplifier having inverting (−) and non-inverting (+) inputs, an optional pair of clamping diodes, D1 and D2, a first transistor, M3, which may be a FET device, coupled between an output of amplifier A1 and ground or VSS, a first thresholding unit 401, which implements an activation function, and a second transistor M4 operatively coupled between an output of amplifier A1 and an input of the thresholding unit 401.

The inverting input of the first amplifier A1 is adapted to receive a weighted sum of the sensor data via the data integration line from the sensor array (e.g., 302 in FIG. 3) to which the classification block 400 is connected. The non-inverting input of the amplifier A1 is connected to VSS in this embodiment. An integration capacitor, $C_{int}$, is connected between the output of the amplifier A1 and the inverting input. The combination of the integration capacitor, $C_{int}$, and the amplifier A1 forms an integrator circuit. The diodes D1 and D2 are connected together in series between a high voltage source, $V_H$, and a low voltage source, $V_L$, with an anode terminal of D1 connected to $V_L$, a cathode of D1 connected to an anode of D2 and to the output of amplifier A1, and a cathode of D2 connected to $V_H$. The diodes D1, D2 limit the output of the integrator circuit between about $V_H$ and about $V_L$. This may be beneficial in some embodiments by clamping very large positive and/or negative voltage values resulting from the integration, given that such values have a negligible effect on the outcome of classification. Typically, $V_H > V_{DD}$ and $V_L < -V_{SS}$. The diodes D1, D2 (and supply voltages $V_H$, $V_L$) are optional and may be omitted in some embodiments. A first source/drain of transistor M4 is connected to the output of amplifier A1, a second source/drain of M4 is connected to an input of the thresholding unit 401, and a gate of M4 is adapted to receive a control signal from row N+2. A first source/drain of transistor M3 is connected to the output of the amplifier A1, a second source/drain of M3 is connected to VSS, and a gate of M3 is adapted to receive a signal from Row N.

An output of the thresholding unit 401 is coupled with an output block 402. The output block 402, in one or more embodiments, includes a plurality of column circuits, each of the column circuits comprising an integrator and corresponding access and processing circuitry. Specifically, each column circuit incudes a transistor M5, a transistor M6, and a transistor M7. Each column circuit further includes a second amplifier, A2, an optional pair of clamping diodes, D3 and D4, and a second thresholding unit 404. Each column circuit is coupled with an output column circuit comprising a transistor M8, and an indicator element, which in one or more embodiments may be a light-emitting diode (LED). In the illustrated circuit, the LED brightness is proportional to the M8 current, which may be an approximately quadratic function of the output voltage of the thresholding unit 404; i.e., the LED brightness being proportional to $(1 - V_{out,th}/V_{p,8})^2$, where $V_{out,th}$ is the output voltage of the thresholding unit, and $V_{p,8}$ is the pinch-off voltage of M8.

A first source/drain of transistor M5 is coupled with a corresponding column line, a second source/drain of M5 is coupled with an inverting input of the amplifier A2, and a gate of M5 is coupled with the output of thresholding unit

401. A non-inverting input of amplifier A2 is connected to VSS. An integration capacitor, $C_{int,1}$, is connected between the inverting input of A2 and an output of A2, thus forming an integrator circuit. A first source/drain of transistor M6 is coupled with the output of the amplifier A2, a second source/drain of M6 is connected to VSS, and a gate of M6 is adapted to receive a control signal from the reset row, row RST, which is connected to the gates of M6 transistors of all columns. A first source/drain of transistor M7 is coupled with the output of amplifier A2, a second source/drain of M7 is coupled with an input of the thresholding unit 404, and a gate of M7 is adapted to receive a control signal from row N+3, which is connected to the gates of the M7 transistors in all columns. Diodes D3 and D4 are connected in series between $V_H$ and $V_L$, in a manner consistent with diodes D1 and D2, and serve as a means of limiting the output voltage of the amplifier A2 (i.e., the output voltage of the integrator) between approximately $V_L$ and $V_H$. A first source/drain of transistor M8 is coupled with a cathode of the LED, an anode of the LED is coupled with VDD, a second source/drain of M8 is connected to VSS, and a gate of M8 is coupled with an output of the thresholding unit 404.

Each column circuit in the output block 402 corresponds to a neuron in the output layer of the equivalent neural network. The brightness of, for instance, LED 1 in column 1, is an indication of the certainty with which an input to the classifier system (e.g., an image) is being classified by the classifier system under class 1; i.e., the higher the brightness level of the LED 1, the higher the certainty that the input belongs to class 1, as determined by the classifier system. Similarly, the higher the brightness of the LED 2, the higher the certainty that the input belongs to class 2, and so on for the rest of the columns, 3 through K. In other embodiments, the output voltages of the thresholding units 404 may be routed to analog-to-digital (A/D) converters for readout. Other forms of indicator or readout circuitry known in the art may also be used.

The classification block 400 may be operated as follows, in conjunction with the sensor array to which it is connected. Rows 1 through N are selected sequentially to scan the sensor array, followed by row N+1 to transfer the weighted sums of the sensor data to the integrator circuit formed by $C_{int}$ and A1, via the data integration line; and finally row N+2 is selected to transfer the output of the integrator to the thresholding unit 401, where the activation function is applied to the integrator output and the result is transferred to the output block 402. This procedure is repeated H times for each data acquisition, where H is the number of neurons in the hidden layer of the equivalent neural network. (Note, the equivalent neural network corresponding to the classification block 400 has only one hidden layer, which may be treated as the first hidden layer; i.e., H=H1).

Prior to each sensor data transfer, the integrator output is reset by M3 (which may be controlled by row N). The module described above ($C_{int}$, A1, M3, M4 and thresholding unit 401) corresponds to a single neuron in the hidden layer of the equivalent neural network. Since this module is used H times (sequentially) per sensor data acquisition, it is implemented only once in hardware. This is in contrast to the output block 402, where the number of columns K corresponds to the number of neurons in the output layer of the equivalent neural network. The weight voltages placed on the column lines are updated by the weight block prior to each selection of row N+2 (in the same manner as described earlier for the sensor array), so that appropriate weights are applied to the output voltages received from the thresholding unit 401 and integrated by the $C_{int,1}$/A2 pair to generate a weighted sum associated with the neurons in the output layer.

During each sensor data acquisition, H output voltages (corresponding to H neurons in the hidden layer of the equivalent neural network) are received sequentially from the thresholding unit 401 and applied to the gates of the M5 transistors. The weight voltages loaded on the column lines 1 through K (where K is the number of neurons in the output layer of the equivalent neural network) with the receipt of the h-th output voltage from the thresholding unit 401 (where 1≤h≤H) correspond to the weights associated with the connections between the h-th neuron in the hidden layer and the neurons 1 through K in the output layer of the equivalent neural network. Since H output voltages are received, H×K weights are loaded by the column lines and the associated weighted sums are generated by the corresponding column integrators. The output of the column integrators are reset by selecting a reset row, row RST (which turns on the M6 transistors) prior to the receipt of the first output voltage from the thresholding unit 401; namely, prior to the first selection of row N+2, in each data acquisition. That is, row RST is selected once per data acquisition, not H times. As a result, the output of the column integrators in the output block is the sum of H weighted sums generated from the H output voltages received from the thresholding unit 401.

In some embodiments, the output columns may further include additional transistors, M9 (not shown) connected in series with integrating capacitors $C_{int,1}$, (i.e., either between the input of A2 and $C_{int,1}$, or between the output of A2 and $C_{int,1}$), with the gates of the M9 transistors connected to row N+2. Therefore, when row N+2 is selected, the M9 transistors are turned on, and the column integrators function the same as described above. When row N+2 is deselected, the M9 transistors are turned off, thus suppressing potential discharge of $C_{int,1}$ via the input and/or the output terminals of A2. Finally, row N+3 is selected to transfer the outputs of the column integrators to the thresholding units 404 (where the activation function is applied) and generate an output.

Figure 5:
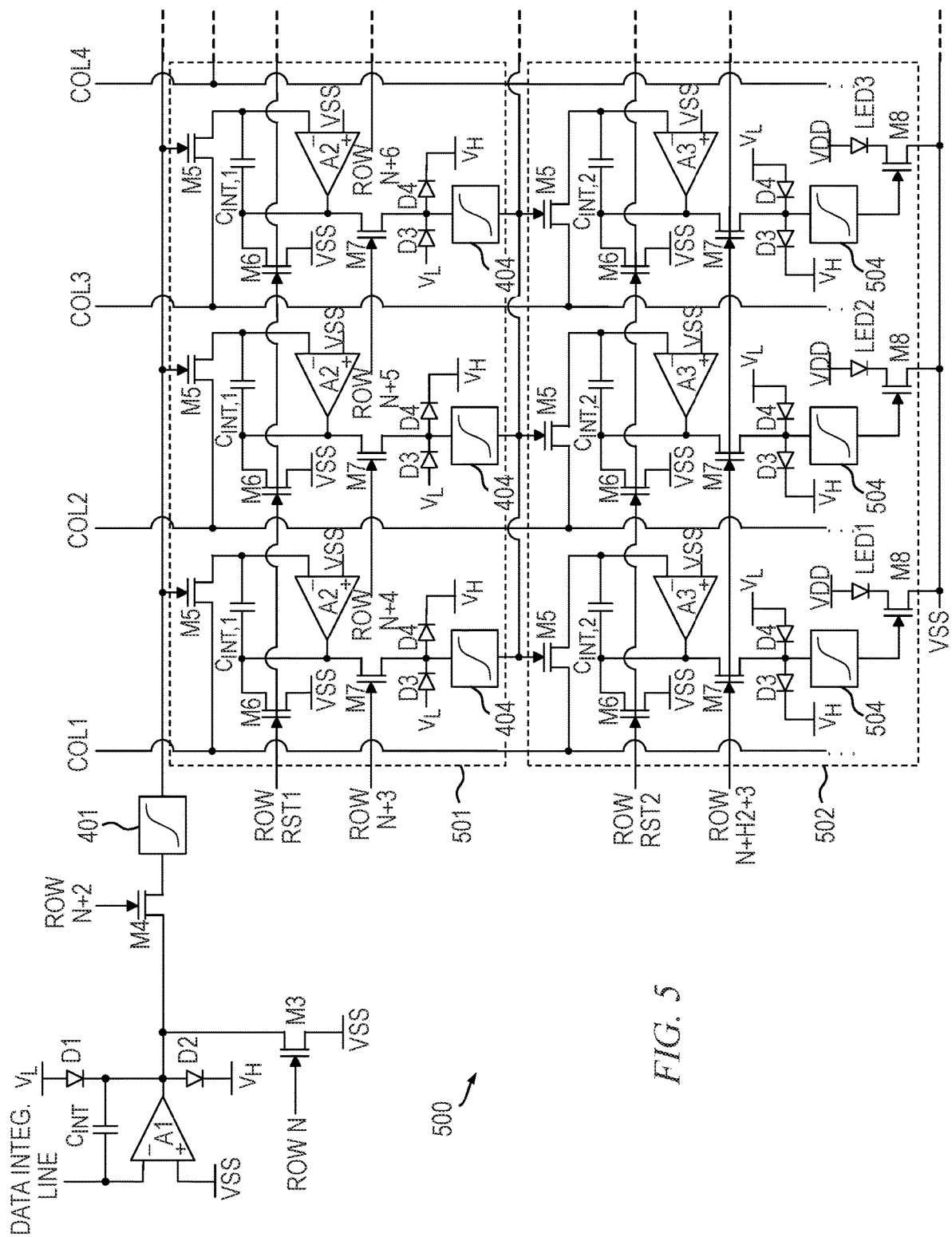
FIG. 5 is an electrical schematic diagram depicting at least a portion of an exemplary classification block corresponding to a neural network having two hidden layers, according to an embodiment of the present invention.

With reference now to FIG. 5, an electrical schematic diagram depicts at least a portion of an exemplary classification block or module 500 corresponding to an equivalent neural network with two hidden layers, according to an embodiment of the invention. The classification block 500 is an illustrative implementation of the classification block 306 shown in FIG. 3. The classification block 500 is consistent with the illustrative classification block 400 (which corresponds to an equivalent neural network with one hidden layer) shown in FIG. 4, except that classification block 500 further includes a hidden block 501, corresponding to the second hidden layer of its equivalent neural network. The output block 502 is implemented in a manner consistent with the output block 402 shown in FIG. 4.

In this exemplary embodiment, the hidden block 501 is implemented in a manner consistent with the output block 502; except that in the output block 502, the M10 transistors are enabled simultaneously by a shared row line, row N+H2+3 (in the same manner that in the output block 402 shown in FIG. 4, the M7 transistors are enabled simultaneously by a shared row line, row N+3); whereas the M7 transistors in the hidden block 501 are enabled sequentially (i.e., one at a time) by the corresponding row lines, row N+3, N+4 . . . N+H2+2 (where H2 is the number of neurons in the second hidden layer of the equivalent neural network).

The classification block 500 may be operated as follows, in conjunction with the sensor array to which it is connected.

Rows 1 through N are selected sequentially to scan the sensor array, followed by rows N+1 and N+2. This is repeated H1 times, where H1 is the number of neurons in the first hidden layer of the equivalent neural network. Subsequently, rows N+3 through N+H2+3 are selected sequentially, followed by row N+H2+3 to generate the output. The number of columns in the hidden block 501, corresponds to the number of neurons, H2, in the second hidden layer of the equivalent neural network; and the number of columns in the output block 502, corresponds to the number of neurons, K, in the output layer of the equivalent neural network.

It will be appreciated that, in some embodiments, parts of the sensor array, the hidden block and/or the output block may be chosen to remain unused for a given classification task; e.g., a classifier system comprised of M×N sensors may be used to implement an equivalent neural network with fewer than M×N neurons in its input layer; or a hidden block with H2 columns may be used to implement an equivalent neural network with fewer than H2 neurons in its second hidden layer. It will be also be appreciated that the classifier system may include further components and/or control signals (not shown) to improve the performance and/or add desired functionality, using techniques known in the art. For instance, when an amplifier or a thresholding unit is not in use, its power supply lines (VDD and VSS) may be disconnected to eliminate standby power consumption in the amplifier or the thresholding unit.

Figure 6:
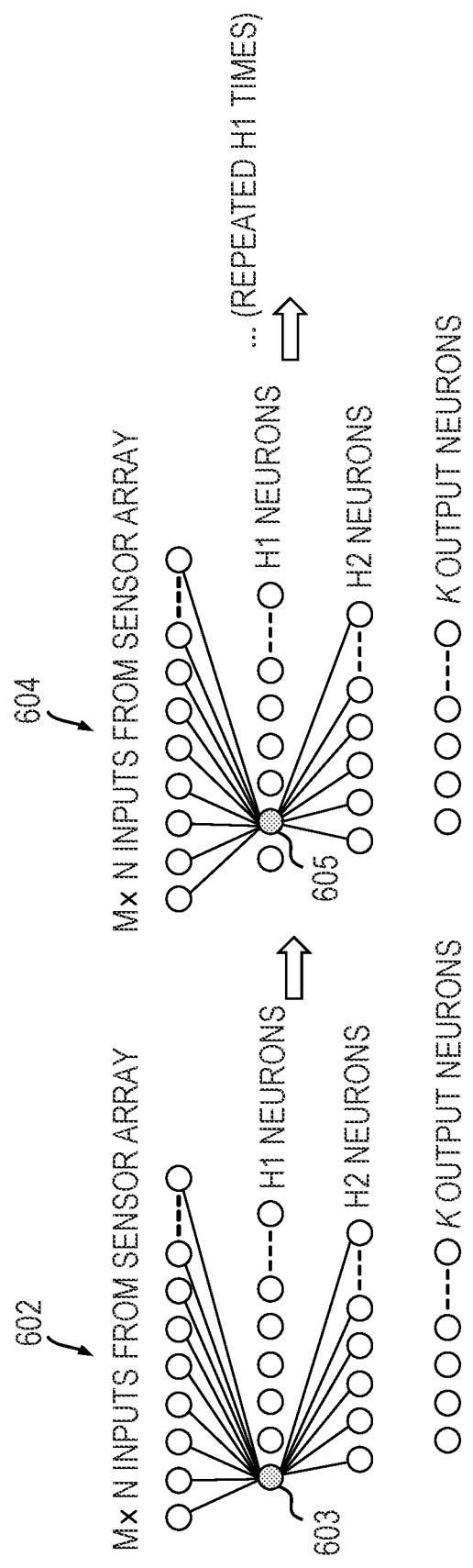

FIGS. 6 and 7 illustrate an equivalent neural network, conceptually depicting an exemplary method of operation of the illustrative classification block 500 shown in FIG. 5, according to an embodiment of the invention. The equivalent neural network is comprised of an input layer with m=M×N neurons, a first hidden layer with H1 neurons, a second hidden layer with H2 neurons, and an output layer with K neurons, where K is an integer. With reference to FIG. 6, during a first step 602, sensor inputs from the sensor array are multiplied by their respective weights (i.e., the weights associated with the illustrated connections between the neurons in the input layer and the first neuron 603 in the first hidden layer), summed up and thresholded (e.g., in unit 401 of FIG. 5, for instance using a sigmoid function) to calculate an output of the first neuron 603 in the first hidden layer. Once the output of the first neuron 603 in the first hidden layer has been calculated, it is multiplied by its respective weights (i.e., the weights associated with the illustrated connections between the first neuron 603 in the first hidden layer and the neurons in the second hidden layer) and fed into the second hidden layer.

Next, in step 604, the sensor inputs are multiplied by their respective weights, summed up and thresholded to calculate an output of the second neuron 605 in the first hidden layer, which is then multiplied by its respective weights and fed into the second hidden layer. The same process is performed for the rest of the neurons in the first hidden layer. Since this process is repeated H1 times, only one integrator (e.g., $C_{INT}$/A1 in FIG. 5) is required for the hardware implementation of the first hidden layer.

The values fed to the neurons in the second hidden layer during each iteration are summed up with the previous values fed to them (using the column integrators $C_{INT,1}$/A2 in the hidden block 501 shown in FIG. 5) until the last iteration; i.e., iteration H1. Each neuron in the second hidden layer requires a column integrator (i.e., $C_{INT,1}$/A2) for the hardware implementation in the illustrative hidden block 501 shown in FIG. 5. Note, the outputs of the column integrators $C_{INT,1}$/A2 are not fed into the column thresholding units 404 until after the H1 iterations have been completed, i.e., when row N+3 is selected after the completion of the H1 iterations, as explained earlier with reference to FIG. 5. The number of (utilized) columns in the hidden block 501 of the classification block 500 shown in FIG. 5 is equal to H2, the number of neurons in the second hidden layer of the equivalent neural network of FIGS. 6 and 7.

With reference now to FIG. 7, in step 702, the output of a first neuron 703 in the second hidden layer is multiplied by its respective weights (i.e., the weights associated with the illustrated connections in step 702) and fed into the output layer. Similarly, in step 704, the output of a second neuron 705 in the second hidden layer is multiplied by its respective weight (i.e., the weights associated with the illustrated connections in step 704) and fed into the output layer. This process is continued for H2 iterations, where H2 is the number of neurons in the second hidden layer. Hence, the outputs of the second hidden layer are multiplied by the respective weights and fed into the output layer, where they are summed up and, after H2 iterations, thresholded (e.g., in units 504, 506, 508 in FIG. 5) to generate the outputs. The number of (utilized) columns in the output block 502 of the classification block 500 shown in FIG. 5 is equal to K, the number of neurons in the output layer of the equivalent neural network of FIGS. 6 and 7.

According to an alternative embodiment of the invention as shown in FIG. 8, the output neurons in the output layer are calculated sequentially rather than in parallel; that is, one output neuron at a time. Specifically, in step 802, a first neuron 803 in the output layer is calculated as a function of the sum of outputs of the neurons in the second hidden layer multiplied by their respective weights (i.e., the weights associated with the illustrated connections in step 802) and thresholded (e.g., in unit 504 of FIG. 5). In step 804, a second neuron 805 in the output layer is calculated as a function of the sum of outputs of the neurons in the second hidden layer multiplied by their respective weights (i.e., the weights associated with the illustrated connections in step 804) and thresholded (e.g., in unit 506 of FIG. 5). This process is continued for K iterations, where K is the number of neurons in the output layer of the equivalent neural network illustrated in FIG. 8. Note, in order to implement this embodiment using the classification block of 500 of FIG. 5, the gates of the M7 transistors in the output block 502 of FIG. 5 need to be controlled using separate row lines, Row N+H2+3, Row N+H2+4 . . . Row N+H2+K+2, which are selected sequentially, in the same manner that the gates of the M7 transistors in the hidden block 501 of FIG. 5 are selected sequentially using row lines, Row N+3, Row N+4 . . . Row N+H2+2, as described previously.

In one or more embodiments in which three (or more) hidden layers are employed, the illustrative methodology conceptually depicted in FIG. 8 would allow implementing a third hidden layer with only one integrator, in a manner similar to that previously described for implementing the first hidden layer. FIG. 9 conceptually depicts at least a portion of an exemplary method for implementing the third hidden layer, according to an embodiment of the invention. Specifically, in step 902, outputs from the neurons in the second hidden layer multiplied by their respective weights (i.e., weights associated with the connections illustrated between neurons in the second hidden layer and the first neuron 903 in the third hidden layer) are summed up and thresholded (e.g., using a sigmoid function) to calculate an output of a first neuron 903 in the third hidden layer. Once the output of the first neuron 903 in the third hidden layer has been calculated, it is multiplied by its respective weights (i.e., weights associated with the connections illustrated between the first neuron 903 in the third hidden layer and the neurons in the output layer) and fed into the output layer.

Next, in step 904, the outputs from the neurons in the second hidden layer multiplied by their respective weights (i.e., weights associated with the connections illustrated between neurons in the second hidden layer and the second neuron 905 in the third hidden layer) are summed up and thresholded to calculate an output of the second neuron 905 in the third hidden layer, which is then multiplied by its respective weights (i.e., weights associated with the connections illustrated between the second neuron 905 in the third hidden layer and the neurons in the output layer) and fed into the output layer. This process is continued for H3 iterations, where H3 is the number of neurons in the third hidden layer. It is to be understood that other approaches, timings and combinations may be similarly employed, in accordance with other embodiments of the invention.

In the block diagram of the exemplary classifier system 300 shown in FIG. 3, the column lines are shared between the sensor array 302 and the classification block 306. Therefore, when the downstream hidden layers (e.g., third hidden layer, forth hidden layer, etc.) and output layer are being calculated, the column lines are not available to the sensor array for a subsequent sensor reading. This pipelining delay is relatively small in typical applications given the smaller size of the classification block compared to that of the sensor array. However, if desired, dedicated weight storage and column lines for the classification block may be employed, as will become apparent to those skilled in the art, in accordance with one or more embodiments of the invention.

Figure 10:
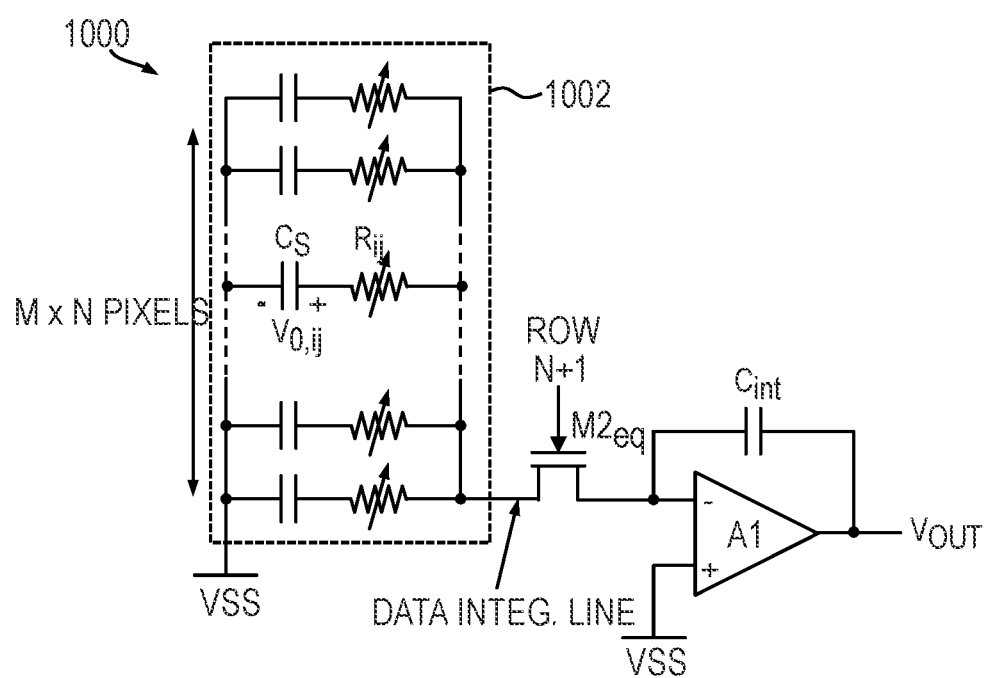
FIG. 10 is an electrical schematic diagram depicting at least a portion of an exemplary circuit for performing integration of sensor data from a sensor array in a classifier system, according to an embodiment of the present invention.

FIG. 10 is an electrical schematic diagram depicting at least a portion of an exemplary circuit 1000 for performing integration of sensor data from a sensor array in a classifier system (e.g., classifier system 300 shown in FIG. 3), according to an embodiment of the invention. The integration circuit 1000 includes an amplifier, A1, which may be implemented using an operational amplifier, an integration capacitor, $C_{int}$, operatively coupled with the amplifier A1, and a transistor, $M2_{eq}$, selectively connecting a sensor array (represented by the sensor block 1002) to the amplifier A1. The sensor block 1002 is an equivalent circuit that illustrates a sensor array at the end of a sensor array scan, e.g. the sensor array 302 of FIG. 3 once a scan has finished, i.e. the $C_S$ capacitors have been loaded with the weight voltages ($V_{ij}$) and the M1 transistors have been disabled. The M2 transistors are represented by an equivalent transistor $M2_{eq}$ connected between the sensor block and the amplifier A1.

More particularly, the sensor block 1002 is connected to a first source/drain of the transistor $M2_{eq}$, a second source/drain of $M2_{eq}$ is connected to an inverting (−) input of the amplifier A1, and a gate of $M2_{eq}$ is adapted for receiving a row N+1 control signal. The integration capacitor $C_{int}$ is connected between the inverting input and an output of the amplifier A1 in a negative feedback configuration, thus forming an integrator circuit. A non-inverting (+) input of the amplifier A1 is connected to a voltage source, which in this embodiment is VSS, and the output of A1 generates an output, $V_{OUT}$, of the circuit 1000.

The sensor block 1002 represents a plurality of sensor cells organized in an M×N array such as that in the sensor block 300, shown in FIG. 3. Each sensor cell corresponding to a given row i and column j, where i and j are integers ($1 \leq i \leq M$ and $1 \leq j \leq N$), includes a storage capacitor, $C_S$, and a sensor device represented, at least in part, by a variable (as a function of the sensor input) resistive element, $R_{ij}$, connected together in series. Specifically, first terminals of the storage capacitors $C_S$ in the respective sensor cells in the sensor block 1002 are connected to a voltage source, which may be VSS in one or more embodiments, a second terminal of the storage capacitor $C_S$ in each sensor cell is connected to a first terminal of the corresponding resistive element $R_{ij}$ in the sensor cell, and second terminals of the resistive elements $R_{ij}$ in the respective sensor cells are connected to the first source/drain of the transistor M1. A voltage, $V_{0,ij}$, present across the storage capacitor $C_S$ of each sensor cell, represents the analog weight value stored in that cell.

When $M2_{eq}$ is turned on by selecting row N+1 (at time t=0), a current, $i_{C_{int}}$, flows through the integration capacitor $C_{int}$ as a function of time, t, and can be determined using the following expression:

$$i_{C_{int}}(t) = \sum_{ij} \frac{V_{0,ij}}{R_{ij}} e^{-t/C_S R_{ij}} = C_{int} \frac{dV_{OUT}}{dt},$$

where $V_{0,ij}$ is the voltage across the storage capacitor $C_S$ in a given sensor cell prior to the selection of row N+1 (at t=0) as previously stated. Using the expression above, the output voltage $V_{OUT}$ can be determined as a function of time as follows:

$$V_{OUT}(t) = \frac{C_S}{C_{int}} \sum_{ij} V_{0,ij} \left(1 - e^{-t/C_S R_{ij}}\right)$$

Based on the assumption that integration time $\Delta t \ll C_S R_{ij}$ (the integration time $\Delta t$ is the time period during which row N+1 is HIGH and therefore $M2_{eq}$ is on, and $C_S R_{ij}$ is the resistance-capacitance (RC) delay associated with the storage capacitance value of $C_S$ and the sensor resistance value of $R_{ij}$), the output voltage can be determined as function of integration time as follows:

$$V_{OUT}(\Delta t) = \frac{\Delta t}{C_{int}} \sum_{ij} V_{0,ij}/R_{ij}.$$

In analogy with the illustrative neural network of FIG. 1, the output voltage $V_{OUT}$ may be expressed as a weighted sum $\Sigma_m (w_m x_m)$ where $1 \leq m \leq M \times N$, $w_m = V_m \Delta t/C_{int}$ and $x_m = 1/R_m = G_m$ (G is the sensor conductance, which is the inverse of resistance, R, by definition). Therefore, the equivalence between the sensor array and the input layer of a neural network becomes apparent from the above equation.

When the sensor array 1002 is scanned, the respective weight voltages $V_{0,ij}$ are stored in the storage capacitors $C_S$ for all cells in rows i and columns j. When the scan is completed, integration is started by selecting row N+1 to calculate the output of a given neuron in the following (i.e., downstream) layer. The integration time $\Delta t$, as well as values for the storage capacitor $C_S$ and resistor $R_{ij}$, are preferably chosen such that the assumption $\Delta t \ll C_S R_{ij}$ holds for all i, j. Prior to the start of each integration, a control signal conveyed on row N can be used to reset the integrator output to an appropriate voltage such as ground or VSS, e.g. by activating the transistor M3 shown in FIGS. 4 and 5.

Figure 11:
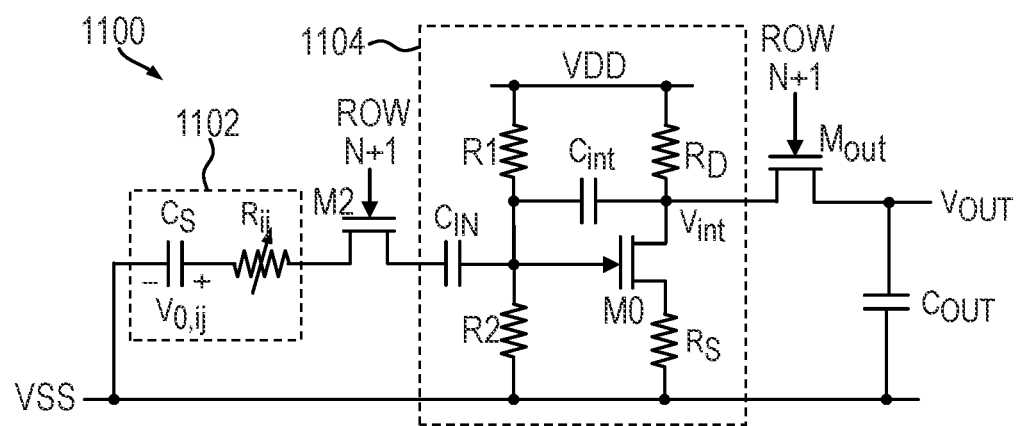
FIG. 11 is an electrical schematic diagram depicting at least a portion of an illustrative circuit operative to perform an integration of sensor data, according to an embodiment of the present invention.

By way of example only and without limitation, FIG. 11 is an electrical schematic diagram depicting at least a portion of an illustrative circuit 1100 operative to perform an integration of sensor data, according to an embodiment of the invention. The sensor data integration circuit 1100 is just one implementation of at least a portion of the exemplary circuit 1000 shown in FIG. 10; other embodiments are similarly contemplated by the invention, as will become apparent to those skilled in the art given the teachings herein. The circuit 1100 includes a first transistor, M2, having a first source/drain coupled with a given sensor cell 1102 in the sensor array, a second source/drain coupled with an input of an integration amplifier 1104, and a gate adapted to receive a row N+1 control signal. The circuit 1100 further includes an illustrative output load comprised of an output transistor $M_{out}$ and an output capacitor, $C_{OUT}$, operatively coupled with an output of the integration amplifier 1104.

The sensor cell 1102, like the sensor cells in the sensor array 1002 shown in FIG. 10, includes a storage capacitor, $C_S$, and a resistive element, $R_{ij}$, connected together in series between a voltage source, which may be VSS, and the transistor M2, where i represents the row and j represents the column corresponding to the cell in the sensory array; the voltage $V_{0,ij}$, stored in the sensor cell, which is measured across the storage capacitor $C_S$ (at time t=0; i.e., before the start of integration), is indicative of the analog weight value stored in the cell i,j. The output voltage $V_{out}$ of circuit 1100 represents the contribution of a single sensor cell (corresponding to a sensor cell located at column i and row j of a sensor array) to the integrator output. The contribution of a given number of sensor cells (i.e., a portion of, or all of the sensor cells in the sensor array) can be determined by superposition.

In this example, a simple common-source amplifier circuit is used for implementing the integration amplifier 1104 (consistent with amplifier A1 in FIG. 10). Specifically, the integration amplifier 1104 includes a transistor device, M0, having a first source/drain connected to a first voltage source, which is VSS in this embodiment, through a source resistor, $R_S$, a second source/drain connected to a voltage supply, which is VDD in this embodiment, through a drain resistor, $R_D$, and a gate coupled to the transistor M2 through a series direct current (DC) blocking capacitor, $C_{IN}$. First and second bias resistors, R1 and R2, are connected in a simple voltage divider arrangement and are provided for setting a DC gate voltage of transistor M0. A first terminal of resistor R1 is connected to VDD, a second terminal of R1 is connected to a first terminal of resistor R2 at the gate of M0, and a second terminal of R2 is connected to VSS. The amplifier 1104 further includes an integration capacitor, $C_{int}$, connected between the second source/drain and the gate of the transistor M0. Provided that the capacitive load $C_{out}$ is sufficiently smaller than the integrating capacitor $C_{int}$, the output integration voltage $V_{OUT}$ is approximately the same as an integration voltage, $V_{int}$, generated at the second source/drain of the transistor M0. More specifically, to the first order, capacitive voltage dividing yields, $V_{OUT}=V_{int}/(1+C_{out}/C_{int})≈V_{int}$ if $C_{out}<<C_{int}$. It will be appreciated that the integration amplifier is not limited to common-source circuits, and various other amplifier configurations known in the art (single-ended or differential) may be similarly employed.

Figure 12:
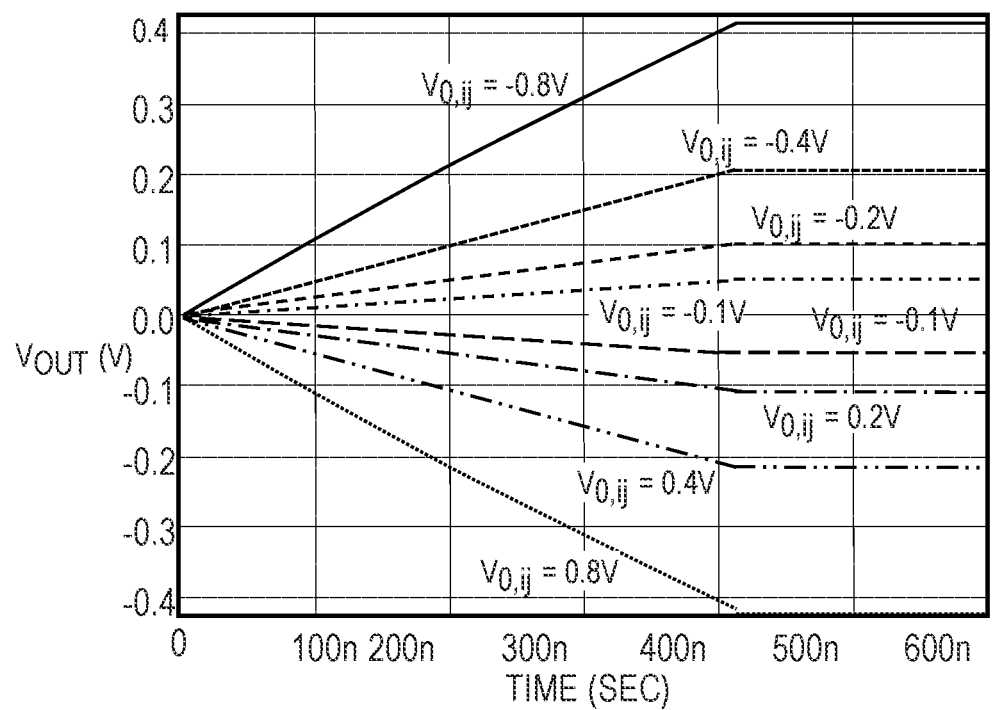
FIGS. 12 and 13 are graphs depicting exemplary waveforms relating to the illustrative sensor data integration circuit shown in FIG. 11, according to an embodiment of the present invention.
Figure 13:
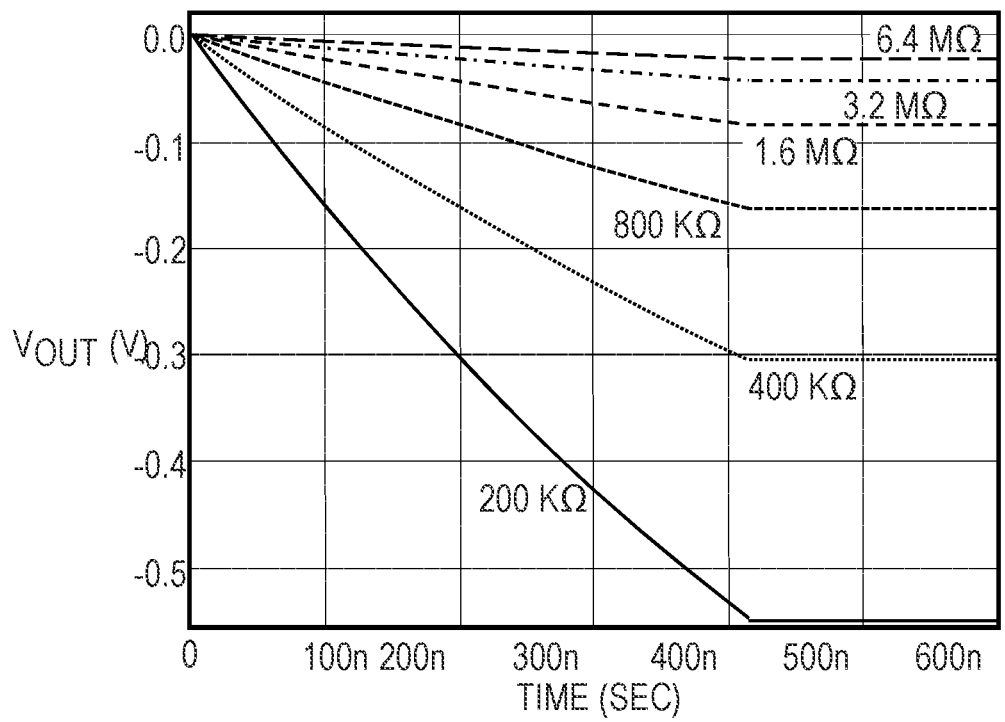

Simulation results, using, for example, an analog electronic circuit simulator (e.g., HSPICE®, a registered trademark of Synopsys, Inc.), were obtained using the exemplary sensor data integration circuit 1100. FIGS. 12 and 13 are graphs depicting exemplary waveforms relating to the illustrative sensor data integration circuit 1100 shown in FIG. 11, according to an embodiment of the invention. For this illustrative simulation, the following circuit parameters are assumed: VDD=2.5 volts (V), VSS=−2.5 volts, R1=10 megohms (MΩ), R2=1 MΩ, $R_D$=1 kilohm (KΩ), $R_S$=100Ω, $C_{int}$=1 picofarad (pF), $C_S$=10 pF, and $C_{IN}$=100 pF. An integration time of approximately 400 nanoseconds (ns) was used for simulation. The transistors used for simulation are n-channel HJFET devices with pinch-off voltages of approximately −2V and W/L of 1. It is to be appreciated, however, that other values may be used for the circuit parameters without departing from the scope of the invention; that is, embodiments of the invention are not limited to any specific component values or operating criteria.

With reference to FIG. 12, the several waveforms show the output voltage $V_{OUT}$ of the circuit shown in FIG. 11, as a function of time (seconds) for different voltage levels, $V_{0,ij}$, stored in the storage capacitor $C_S$ with $R_{ij}$ equal to 600 KΩ. As can be seen from FIG. 12, the output voltage $V_{OUT}$ changes substantially linearly from zero volts to its final value during the integration period (about 400 ns). With $R_{ij}$ fixed at 600 KΩ, the final value of $V_{OUT}$ will be a function of the voltage $V_{0,ij}$ across the storage capacitor $C_S$. For $V_{0,ij}$=−0.8V, $V_{OUT}$ will reach about 0.42V, for $V_{0,ij}$=−0.4V, $V_{OUT}$ will reach about 0.21V, for $V_{0,ij}$=−0.2V, $V_{OUT}$ will reach about 0.1V, for $V_{0,ij}$=−0.1V, $V_{OUT}$ will reach about 0.05V, for $V_{0,ij}$=0.1V, $V_{OUT}$ will reach about −0.05V, for $V_{0,ij}$=0.2V, $V_{OUT}$ will reach about −0.1V, for $V_{0,ij}$=0.4V, $V_{OUT}$ will reach about −0.21V, and for $V_{0,ij}$=0.8V, $V_{OUT}$ will reach about −0.42V.

With reference to FIG. 13, the several waveforms show the circuit output voltage $V_{OUT}$ as a function of time (seconds) for different resistance values of $R_{ij}$, with $V_{0,ij}$ equal to 0.6 volts. As can be seen from FIG. 13, the output voltage $V_{OUT}$ changes substantially linearly from zero volts to its final value during the integration period (about 400 ns), for a wide range of $R_{ij}$ values. With $V_{0,ij}$ fixed at 0.6 volts, the final value of $V_{OUT}$ will be a function of the resistance $R_{ij}$. For $R_{ij}$=6.4 MΩ, $V_{OUT}$ will reach about −0.03V, for $R_{ij}$=3.2 MΩ, $V_{OUT}$ will reach about −0.5V, for $R_{ij}$=1.6 MΩ, $V_{OUT}$ will reach about −0.08V, for $R_{ij}$=800 KΩ, $V_{OUT}$ will reach about −0.16V, for $R_{ij}$=400 KΩ, $V_{OUT}$ will reach about −0.31V, and for $R_{ij}$=200 KΩ, $V_{OUT}$ will reach about −0.55V.

Figure 14:
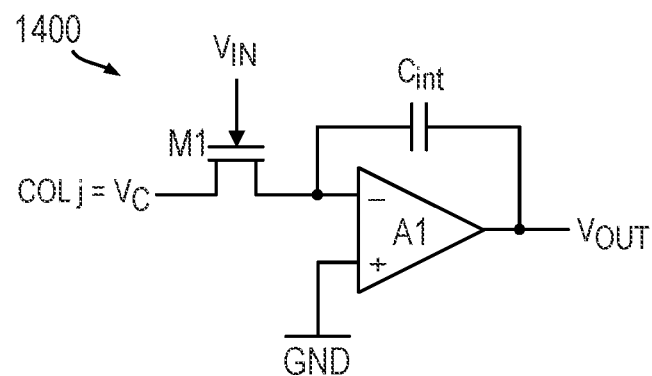
FIGS. 14 and 15 are electrical schematic diagrams depicting at least a portion of two exemplary circuits for implementing a neuron (i.e., column circuit) in a hidden block or an output block of a classification block, according to embodiments of the present invention.
Figure 15:
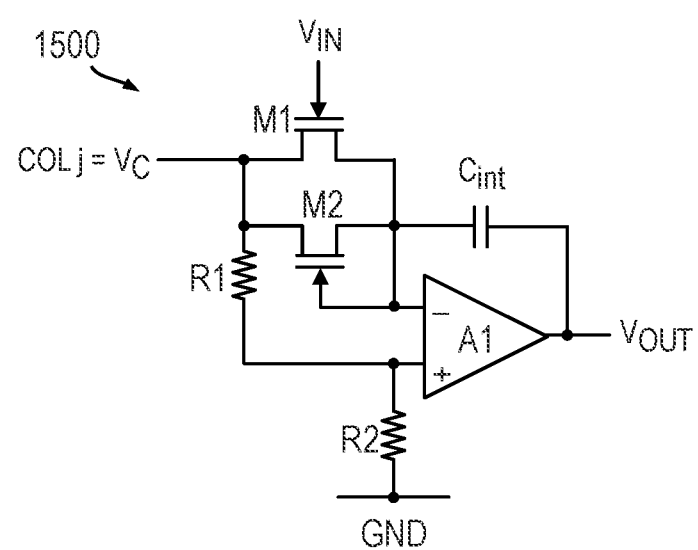

FIGS. 14 and 15 are electrical schematic diagrams depicting at least a portion of two different exemplary circuits 1400 and 1500, respectively, for implementing a neuron (i.e., column circuit) in a hidden block or an output block of a classification block (e.g., classification block 500 shown in FIG. 5), according to embodiments of the invention. As shown in FIG. 14, the neuron circuit 1400 includes a first transistor, M1, having a first source/drain connectable to a corresponding column line, COL j, where j is an integer, a second source/drain connected with an inverting (−) input of an amplifier, A1, which in this embodiment is an operational amplifier, and a gate adapted to receive an input signal, $V_{IN}$. A non-inverting (+) input of the amplifier A1 is connected to ground (e.g., zero volt). The circuit 1400 further includes an integration capacitor, $C_{int}$, connected between an output of the amplifier A1 and the inverting input of the amplifier. The output of the amplifier A1 generates an output voltage, $V_{OUT}$, of the circuit 1400.

The transistor M1 in the circuit 1400 is preferably biased in a linear regime. A voltage, $V_C$, on the corresponding column line COL j is supplied as an input to the circuit 1400 by the weight block. In one or more embodiments, the control signal $V_{IN}$ is generated as an output of a thresholder (e.g., 401 in FIG. 4), for example a sigmoid activation function. For the circuit 1400, the output voltage $V_{OUT}$ as a function of an integration time Δt can be determined according to the following expression:

$$V_{OUT}(\Delta t) =$$

$$-\left(\frac{2I_{DSS}}{V_p^2}\right)\left(\frac{\Delta t}{C_{int}}\right)\left[(V_{IN}-V_p)V_C \pm \frac{V_C^2}{2}\right] \approx -\left(\frac{2I_{DSS}}{V_p^2}\right)\left(\frac{\Delta t}{C_{int}}\right)(V_{IN}-V_p)V_C,$$

where $I_{DSS}$ is the saturation current of the HJFET at zero gate-to-source bias, and $V_p$ is the pinch-off voltage of the HJFET. With reference to the term $$\pm \frac{V_C^2}{2},$$

the plus (+) and minus (−) signs are applicable to $V_C \leq 0$ and $V_C \geq 0$, respectively. For conventional thin-film transistors, a similar equation may be obtained by replacing the term $$\frac{2I_{DSS}}{V_p^2}$$

with the term $\mu C_i W/L$, and replacing $V_p$ with $V_T$, where $\mu$ is charge-carrier effective mobility, W is the channel width, L is the channel length, $C_i$ is the gate dielectric capacitance per unit area, and $V_T$ is the threshold voltage of the transistor.

Even though the output of circuit 1400 does not implement an exact analog multiplication, this circuit may be used in one or more embodiments to perform a classification task. This is because, as known in the art, one or more of the following apply to deep neural networks: (i) high precision multiplication is not necessarily required for providing accurate classification results; (ii) in an appropriately-trained neural network, particularly with regularization, the resulting weights are generally small, and/or the abnormally large weights may be reduced without substantial reduction in classification accuracy; and (iii) the training algorithm may be chosen such that the weights obtained from training are smaller than a desired value (bound). Therefore, with sufficiently small (in absolute value) $V_C$, the $$\frac{V_C^2}{2}$$

term may become negligible or have negligible effect on the classification results. However, it is also possible to eliminate the $$\frac{V_C^2}{2}$$

term, for example by using the exemplary circuit 1500 shown in FIG. 15.

More particularly, circuit 1500 includes a first transistor, M1, which in this embodiment is an HJFET, having a first source/drain connectable to a corresponding column line, COL j, where j is an integer, a second source/drain connected with an inverting (−) input of an amplifier, A1, which in this embodiment is an operational amplifier, and a gate adapted to receive an input signal, $V_{IN}$. The circuit 1500 further includes a second transistor, M2, which in this embodiment is an HJFET having its gate terminal connected its source/drain terminal. Specifically, a first source/drain and a gate of transistor M2 is connected with the inverting input of the amplifier A1, and a second source/drain of M2 is connected to the column line COL j. The circuit 1500 includes first and second resistors, R1 and R2, respectively, connected in a voltage divider arrangement with a non-inverting (+) input of the amplifier A1. Specifically, a first terminal of the resistor R1 is connected with the corresponding column line COL j, a second terminal of R1 is connected to a first terminal of resistor R2 and to the non-inverting input of the amplifier A1, and a second terminal of R2 is connected to ground (e.g., zero volt). The circuit 1500 further includes an integration capacitor, $C_{int}$, connected between an output of the amplifier A1 and the inverting input of the amplifier. The output of the amplifier A1 generates an output voltage, $V_{OUT}$, of the circuit 1500.

In one or more embodiments, the resistors R1 and R2 are the same value, and therefore a voltage, $V_C$, on the corresponding column line COL j supplied as an input to the circuit 1500 is divided by two and applied to the non-inverting input of the amplifier A1; i.e., the non-inverting (+) input of amplifier A1 is biased at $V_C/2$ and as a result the inverting (−) input of amplifier A1 is virtually biased at also $V_C/2$. Therefore, a first source/drain terminal of M1 and M2 receive $V_C$ (via COL j) and a second source/drain terminal of M1 and M2 receive $V_C/2$ (via the inverting terminal of A1); and the gate of M1 receives the input $V_{IN}$ while the gate of M2 receives $V_C/2$ (via the inverting terminal of A1). Since the current flowing into $C_{int}$ is given by the algebraic sum of the currents flowing through M1 and M2, it is straightforward to find that the square term $$\pm \frac{V_C^2}{2}$$

is eliminated in the algebraic sum, and the output voltage $V_{OUT}$ may be expressed as follows:

$$V_{OUT}(\Delta t) = -\left(\frac{I_{DSS}}{V_p^2}\right)\left(\frac{\Delta t}{C_{int}}\right)V_{IN}V_C$$

Therefore $V_{OUT}$ may be expressed accurately as $w_j V_{IN}$, where $$w_j = \left(\frac{I_{DSS}}{V_p^2}\right)\left(\frac{\Delta t}{C_{int}}\right)V_C$$

is the weight of the associated connection in the equivalent neural network, corresponding to column j. It will be appreciated by those skilled in the art that other circuits, generally known in the art as analog multipliers, may be similarly employed to generate an output proportional to $V_{IN}V_C$ and used for implementing the column integrators in the hidden blocks and/or the output blocks of the disclosed classification system.

The circuits 1400 and 1500 may optionally include an integration control transistor, e.g. $M_{int}$ (not shown) in series with $C_{int}$, e.g., a first source/drain of $M_{int}$ may be connected to the inverting (−) input of the amplifier A1, a second source/drain of $M_{int}$ may be connected to a first terminal of $C_{int}$ and a second terminal of $C_{int}$ may be connected to the output of the amplifier A1. The gate of $M_{int}$ may be controlled by a control signal that enables $M_{int}$ (and thus allows the charge or discharge of $C_{int}$) only during a desired integration period. For instance, if the circuit 1400 or 1500 is utilized in the hidden block 501 of the classification block 500 shown in FIG. 5, the gate of $M_{int}$ may be controlled by Row N+2. In both circuits 1400 and 1500, the output voltages of the amplifiers may be reset prior to integration, e.g. in a manner consistent with using transistor M6 and control signal Row RST1 to reset the output voltage of the amplifier A2 in the hidden block 501 of the classification block 500 shown in FIG. 5.

Figure 16:
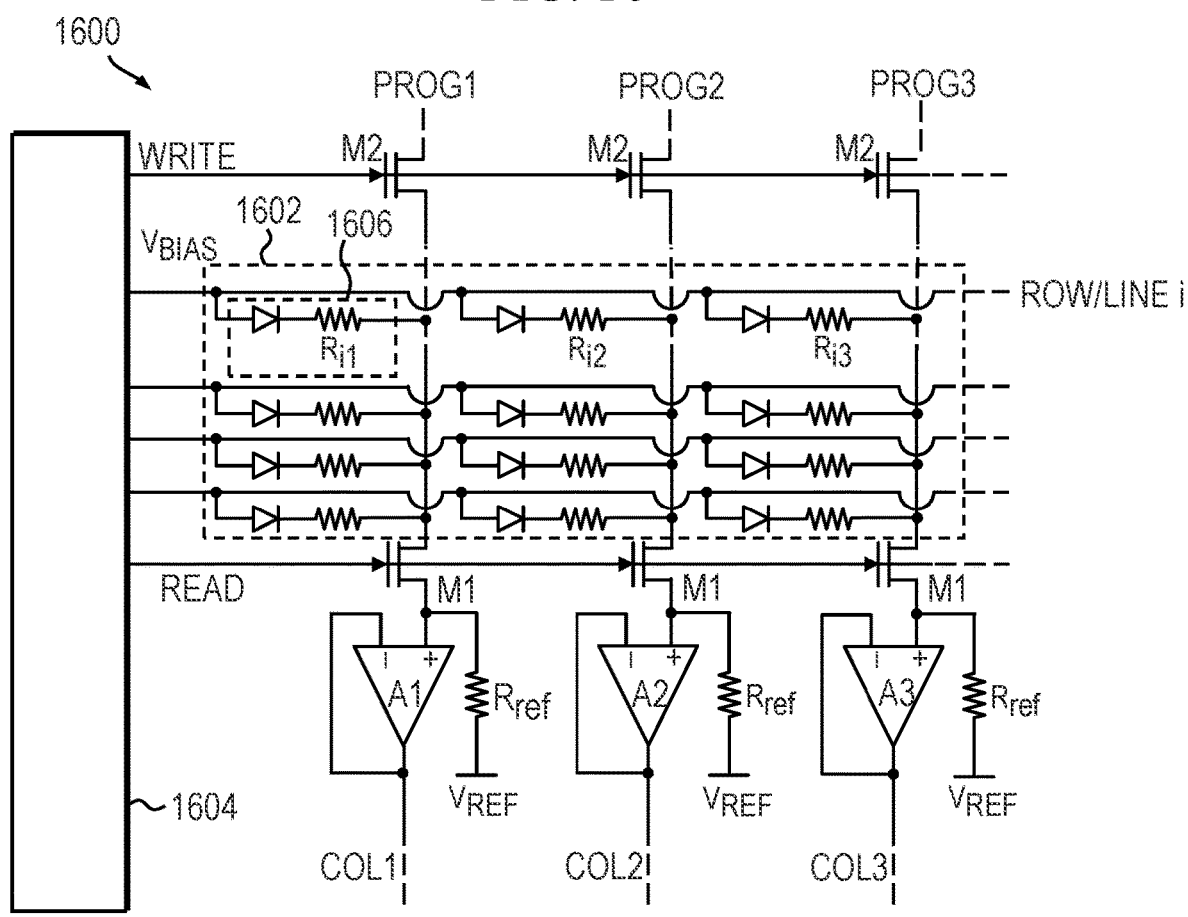
FIG. 16 is an electrical schematic diagram depicting at least a portion of an exemplary circuit for implementation of weights, according to an embodiment of the present invention.

Turning now to an implementation of a weighting function, there are various techniques known in the art which are suitable for use with embodiments of the invention. By way of example only and without limitation, FIG. 16 is an electrical schematic diagram depicting at least a portion of an exemplary weighting circuit 1600 configured for implementing a weighting function, according to an embodiment of the invention. The weighting circuit 1600, in one or more embodiments, may be used to implement at least a portion of the weight block 310 shown in FIG. 3. It is to be appreciated that embodiments of the invention are not limited to the specific implementation shown, but rather various other techniques and implementations may be used, as will become apparent to those skilled in the art given the teachings herein.

The weighting circuit 1600 includes a weighting array 1602 connected with a row selection block or circuit 1604. The weighting array 1602, in this embodiment, includes a plurality of memory elements 1606 arranged in a cross-bar configuration. Each of the memory elements may be implemented using, for example, resistive memory, phase-change memory, conductive bridge memory, and a selecting element, such as, for example, a diode or an ovonic threshold switch (OTS). In one or more other embodiments, a thin-film transistor (TFT), such as, for example, a heterojunction field-effect transistor (HJFET) with programmable threshold voltage (shifted by applying bias), may be used as the memory element. The memory elements may be programmable as illustrated in this embodiment, or read-only in other embodiments where the PROG j columns and the WRITE row may be omitted. Some embodiments may include stacked arrays of memory elements.

In the illustrative embodiment shown in FIG. 16, each of the memory elements 1606 comprises a diode or other selection device connected in series with a resistive element, $R_{ij}$, where i is an integer representing the row/line number and j is an integer representing the column number in the array 1602. Each selected row i, under control of the row selection block 1604, generates a bias signal, $V_{BIAS}$, which is supplied to all storage elements coupled to that row i. In the illustrative embodiment shown in FIG. 16, an anode terminal of the diode in each memory element 1606 is connected to a corresponding row, a cathode of the diode is connected with a first terminal of the resistive element $R_{ij}$, and a second terminal of the resistive element is connected with a corresponding column program line, PROGj.

During the write period of the weighting circuit 1604 (i.e., prior to sensor data acquisition and classification operations of the classifier system), the memory elements are programmed to values representing the weights in an equivalent neural network, by deselecting the READ line and selecting the WRITE line, and applying appropriate voltages on the row and column lines. Thus, each memory element 1606 in the array 1602 may be individually selected and programmed to a desired value using a unique pair of a corresponding row and program line associated therewith, as known in the art with respect to cross-bar memory configurations.

During the read period of the weighting circuit 1604 (i.e., during the sensor data acquisition and classification operations of the classifier system), the WRITE line is deselected, the READ line is selected, and the values stored in a desired row of the memory elements are provided to the column lines COLj by selecting the desired row line. It will be appreciated that during the read operation of the weighting circuit, the row lines may be selected using the same or different voltage values, $V_{bias}$, compared to that during the write operation. In one example where the weighting circuit 1600 is used to implement at least a portion of the weight block 310 shown in FIG. 3, the number of columns in array 1602 may be the same as the number of columns in sensor array 302 (M, or D if D>M), and the number of rows in array 1602 may depend on the number of layers and the number of neurons in each layer of the equivalent neural network being implemented. For instance, if the classification block shown in FIG. 5 is used to implement at least a portion of the classification block 306 shown in FIG. 3, the number of rows in array 1602 may be equal to N×H1+H2+K, where N is the number of rows in the sensor array 302, H1 is the number of neurons in the first hidden layer of the equivalent neural network, H2 is the number of neurons in the second hidden layer of the equivalent neural network, and K is the number of neurons in the output layer of the equivalent neural network.

Each column j in the memory array 1602 is selectively coupled with an output circuit configured to generate an output signal, $V_{colj}$, at a corresponding output, COLj, of the weighting circuit 1600. Specifically, each output circuit in column 1 includes an amplifier, A1, which may be an operational amplifier, connected with a first transistor, M1. The inverting (−) input of the amplifier A1 is connected to an output of the amplifier. A non-inverting (+) input of the amplifier A1 is coupled with a first source/drain of the transistor M1, a second source/drain of M1 is connected with the corresponding program line, PROGj, in the array 1602, and a gate of M1 is adapted to receive a control signal, READ, supplied by the row selection block 1604. A reference resistor, $R_{ref}$, is connected between the non-inverting input of the amplifier A1 and $V_{REF}$. The output of the amplifier A1 generates an output signal, $V_{COLj}$, at the output COLj of column j.

The voltage $V_{colj}$ generated at the output COLj of a given column j can be closely determined using the following expression:

$$V_{colj} \approx \frac{R_{ref} V_{BIAS} + R_{ij} V_{REF}}{R_{ij} + R_{ref}}$$

When $V_{BIAS}$ is set equal to $-V_{REF}$, where $V_{REF}<0$, the output voltage $V_{colj}$ of column j can be closely determined as a function of the resistances $R_{ij}$ and $R_{ref}$ as follows:

$$V_{colj} \approx V_{REF} \frac{R_{ij}/R_{ref} - 1}{R_{ij}/R_{ref} + 1}$$

Here, the resistances $R_{ij}$ and $R_{ref}$ function essentially as a voltage divider in determining the voltage contribution to the total output voltage. In this regard, memory elements in a given row are selected at a time.

Figure 17:
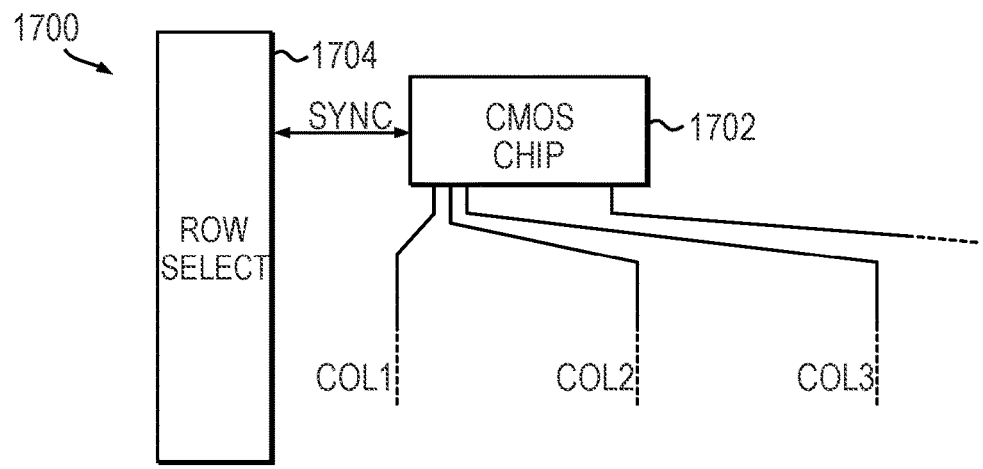
FIG. 17 is a block diagram depicting at least a portion of a weighting circuit suitable for use in a classification system according to another embodiment of the invention.

FIG. 17 is a block diagram depicting at least a portion of a weighting circuit 1700 suitable for use in a classification system (e.g., in weight block 310 shown in FIG. 3) according to another embodiment of the invention. In this embodiment, the weights are stored in a small CMOS chip 1702 which is coupled to row selection circuitry 1704. The chip 1702, which can be implemented as read-only and/or programmable memory, may reside on a corner/side of a large-area classifier sheet, thus having a minimal impact on the mechanical flexibility of the sheet. One or more synchronization signals, SYNC, passed between the row selection circuitry 1704 and the chip 1702 are used to control the weighting signals generated as outputs on the respective column lines, COL1, COL2, COL3, . . . , COLj, where j is an integer representing the number of columns in the weighting circuit 1700.

Figure 18:
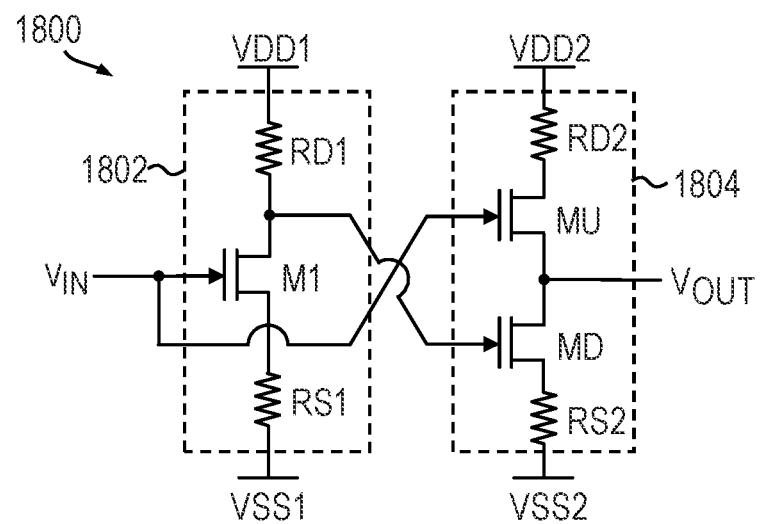
FIG. 18 is an electrical schematic diagram depicting at least a portion of an exemplary thresholding circuit suitable for use in conjunction with one or more embodiments of the invention.

By way of example only and without limitation, an illustrative implementation of a thresholding circuit will now be described, with reference to FIG. 18. More particularly, FIG. 18 is an electrical schematic diagram depicting at least a portion of an exemplary thresholding circuit 1800 suitable for use in conjunction with one or more embodiments of the invention. For example, the thresholding circuit 1800 may be used to form the thresholding units (e.g., 401, 404, 504, etc.) in FIG. 5. The thresholding circuit 1800 comprises an inverter circuit 1802 having an input configured to receive an input signal, $V_{IN}$, supplied to the thresholding circuit, and an output for generating an inverted version of the input signal. The thresholding circuit 1800 further comprises a buffer circuit 1804 coupled with the inverter circuit 1802, the buffer circuit having an input coupled to the output of the inverter circuit and having an output configured to generate an output signal, $V_{OUT}$.

The inverter circuit 1802 includes a first transistor, M1, which may be an n-channel HJFET having a first source/drain coupled with a first terminal of a first resistor, RS1, a second source/drain coupled with a first terminal of a second resistor, RD1, and a gate adapted to receive the input signal $V_{IN}$. A second terminal of resistor RS1 is connected to a first voltage source, VSS1, and a second terminal of resistor RD1 is connected to a first supply voltage, VDD1. The junction between the second source/drain of transistor M1 and resistor RD1 forms the output of the inverter circuit 1802. The buffer circuit 1804 includes a first transistor, MU, which may be an n-channel HJFET having a first source/drain connected to a first terminal of a third resistor, RD2, and a gate adapted to receive the input signal $V_{IN}$. A second terminal of resistor RD2 is connected to a second supply voltage, VDD2. The buffer circuit 1804 further includes a second transistor, MD, which may be an n-channel HJFET having a first source/drain connected to a first terminal of a fourth resistor, RS2, a second source/drain connected to a second source/drain of transistor MU, and a gate coupled with the output of the inverter circuit 1802 at the second source/drain of transistor M1. A second terminal of resistor RS2 is connected to a second voltage source, VSS2. The junction between transistors MU and MD forms the output of the buffer circuit 1804 for generating the output signal $V_{OUT}$. In some embodiments, one or more of the passive resistors (RD, RD2, RS, and RS2) may be replaced by active loads. For example, an n-channel HJFET with its gate terminal connected to its source terminal can function as an active load.

As is known in the art, a buffer circuit comprised of a pair of complementary pull-up and pull-down transistors may be used to approximate a sigmoid or a similar activation function, with adequately symmetric output values with respect to negative and positive input voltages. Other complementary circuits have also been used in the art. However, complementary transistors are not available in many thin-film transistor technologies, and when available (e.g. in the case of HJFET), fabricating both n-channel and p-channel transistors increases the number of process steps and generally results in higher fabrication costs that may be prohibitive in many applications in large-area and flexible electronics. In the thresholding circuit 1800, the two transistors MU and MD in the buffer circuit 1804 function as pull-up and pull-down devices, respectively, even though both transistors have the same channel type (e.g., n-channel) in this embodiment. This is because while MU and MD are not complementary, they receive complementary inputs at their gates, i.e. the input signal $V_{IN}$ and the inverse (complementary form) of $V_{IN}$ generated by the inverter circuit 1802 are fed to the buffer circuit 1804. As a result, the thresholding circuit 1800 can approximate an activation function with sufficiently symmetric output characteristics for positive and negative input voltages.

Figure 19:
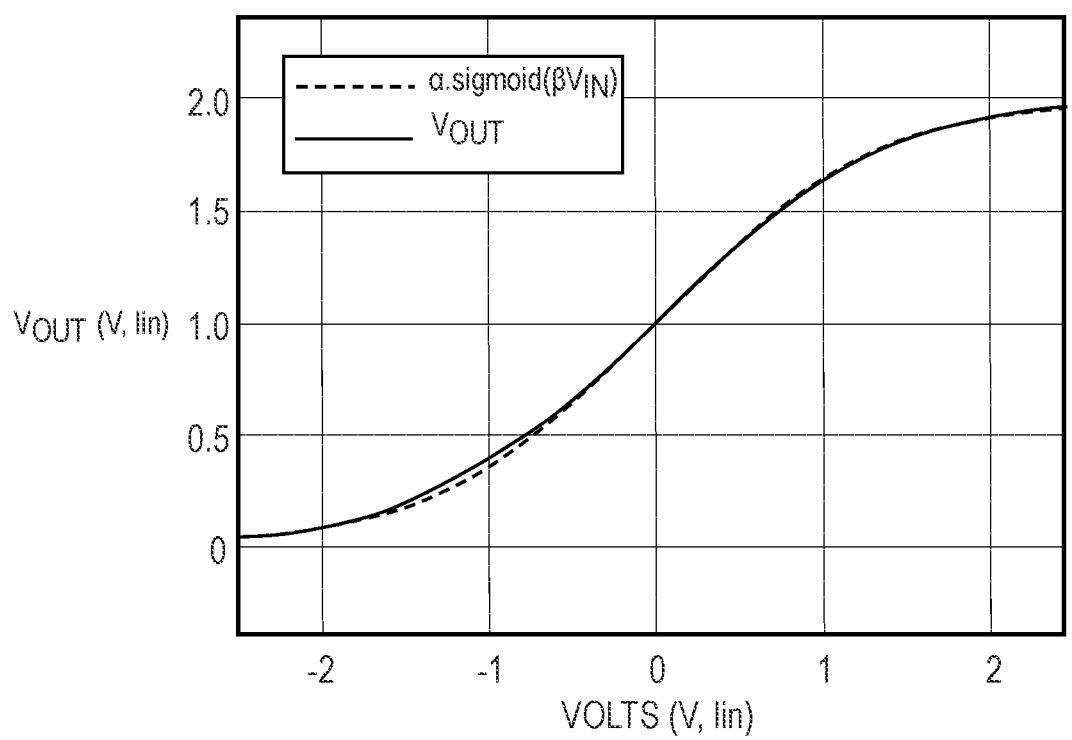
FIG. 19 is a graph showing waveforms relating to an exemplary analog electronic circuit simulation of the exemplary thresholding circuit shown in FIG. 18, according to an embodiment of the present invention.

FIG. 19 is a graph showing an exemplary electronic circuit simulation (e.g., using HSPICE) of the thresholding circuit 1800 shown in FIG. 18. In this illustrative embodiment, the following parameter values are assumed: VDD1=VDD2=2 volts (V); RD2=0 ohm (Ω); VSS1=VSS2=0 V; and RD1=RS1=RS2=250Ω. With reference to FIG. 19, the output voltage $V_{OUT}$ of the simulated circuit (solid line) closely approximates a sigmoid function (dashed line), i.e. $V_{out} \approx \alpha$ sigmoid $(\beta V_{in})$. The coefficients $\alpha$ and $\beta$ may be adjusted in various ways, including: (i) adjusting the circuit elements and power supply levels; and (ii) adding resistive voltage dividers, or capacitive voltage dividers at the input and/or output of the circuit 1800. In this particular example, $\alpha=2$ and $\beta=2.4$.

It will be appreciated that various other activation functions known in the art, of the so-called "S" shape similar to the sigmoid function may also be approximated using the circuit 1802. A rectified linear unit (ReLU) may be implemented using a diode (and if required, a series resistor). Given that the gate/channel interface of an HJFET forms a p-n heterojunction, in some embodiments, a diode may be implemented by using the gate terminal of an HJFET as the first terminal of the diode, and using the drain and/or the source terminal of the HJFET as the second terminal of the diode.

Given the discussion thus far, it will be appreciated that, in general terms, an exemplary classifier system for implementing an equivalent deep neural network includes a weight block, a classification block, a row selector and a sensor array operatively coupled with the weight block, the classification block and the row selector. The sensor array comprises a plurality of sensor cells corresponding to respective neurons in an input layer of the equivalent DNN, the sensor cells being arranged in a two-dimensional matrix configuration, row lines, column lines, a data integration line and an integration start line.

The classifier system is configured such that the sensor cells share a common terminal connected to the data integration line, the row lines are controlled by the row selector, and the column lines receive respective weight values from the weight block, the weight values received from the weight block corresponding to connection weights in the equivalent DNN. The classification block includes a first integrator receiving a signal generated on the data integration line when the integration start line is selected, and a first thresholding unit receiving a signal from the first integrator, the first thresholding unit operatively coupled to an array of second integrators and second thresholding units arranged in a two-dimensional matrix configuration. The array of second integrators and second thresholding units include row lines, controlled by the row selector, and column lines receiving respective weight values from the weight block.

Given the discussion thus far, it will be further appreciated that a method of classifying data acquired from a sensor array includes: providing a classifier system implementing an equivalent deep neural network (DNN), the classifier system including a weight block, a classification block, a row selector, and the sensor array operatively coupled with the weight block, the classification block and the row selector, the sensor array comprising row lines, column lines, a data integration line, an integration start line and a plurality of sensor cells corresponding to respective neurons in an input layer of the equivalent DNN, the sensor cells arranged in a two-dimensional matrix configuration, the classification block comprising at least a first integrator coupled to a first thresholding unit, a classification array arranged in a two dimensional matrix of second integrators coupled to corresponding second thresholding units, row lines and column lines; resetting the second integrators in the classification block; resetting a first integrator in the classification block; scanning the sensor array sequentially by selecting a given one of the row lines of the classification array and loading prescribed voltages provided by the column lines onto storage capacitors included in the respective sensor cells coupled to the given one of the row lines, the prescribed voltages corresponding to connection weights associated with the neurons in the input layer of the equivalent DNN; generating a weighted sum of sensor readings obtained from scanning the sensor array by connecting the sensor array to the first integrator; thresholding the weighted sum of the sensor readings by applying an activation function using the first thresholding unit; multiplying the thresholded weighted sum of the sensor readings with the prescribed voltages corresponding to connection weights provided by the column lines using the second integrators in the selected given one of the row lines of the classification array, the prescribed voltages corresponding to connection weights between neurons in a first hidden layer and neurons in one of a next hidden layer and an output layer of the equivalent DNN; generating a cumulative weighted sum of the thresholded weighted sums of the sensor readings by repeating the steps of resetting a first integrator, sequentially scanning the sensor array, generating the weighted sum of sensor readings, thresholding the weighted sum of the sensor readings and multiplying the thresholded weighted sum of the sensor readings for H1 cycles using the second integrators in each column of the selected given one of the row lines of the classification array, H1 being a number of neurons in the first hidden layer of the equivalent DNN; and generating an output by applying the cumulative weighted sum to the second thresholding units in the corresponding columns of the selected given one of the row lines of the classification array, or generating corresponding inputs for the second integrators in a next subsequent row of the classification array.

At least a portion of the apparatus, methods and/or system described above may be implemented in an integrated circuit. In forming integrated circuits, identical dies are typically fabricated in a repeated pattern on a surface of a semiconductor wafer. Each die includes a device described herein, and may include other structures and/or circuits. The individual dies are cut or diced from the wafer, then packaged as an integrated circuit. One skilled in the art would know how to dice wafers and package die to produce integrated circuits.

Those skilled in the art will appreciate that the exemplary structures discussed above can be distributed in raw form (i.e., a single wafer having multiple unpackaged chips), as bare dies, in packaged form, or incorporated as parts of intermediate products or end products that benefit from having classification circuitry formed in accordance with one or more of the exemplary embodiments.

The illustrations of embodiments described herein are intended to provide a general understanding of the various embodiments, and they are not intended to serve as a complete description of all the elements and/or features of apparatus, methods and systems that might make use of the circuits and techniques described herein. Many other embodiments will become apparent to those skilled in the art given the teachings herein; other embodiments are utilized and derived therefrom, such that structural and logical substitutions and changes can be made without departing from the scope of this disclosure. It should also be noted that, in some alternative implementations, some of the steps of exemplary methods described herein may occur out of the order described or noted in the figures (where shown). For example, two steps described or shown in succession may, in fact, be executed substantially concurrently, or certain steps may sometimes be executed in the reverse order, depending upon the functionality involved. The drawings are also merely representational and are not drawn to scale. Accordingly, the specification and drawings are to be regarded in an illustrative rather than a restrictive sense.

Embodiments are referred to herein, individually and/or collectively, by the term "embodiment" merely for convenience and without intending to limit the scope of this application to any single embodiment or inventive concept if more than one is, in fact, shown. Thus, although specific embodiments have been illustrated and described herein, it should be understood that an arrangement achieving the same purpose can be substituted for the specific embodiment(s) shown; that is, this disclosure is intended to cover any and all adaptations or variations of various embodiments. Combinations of the above embodiments, and other embodiments not specifically described herein, will become apparent to those of skill in the art given the teachings herein.

The terminology used herein is for the purpose of describing particular embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. Terms such as "above" and "below," where used, are intended to indicate positioning of elements or structures relative to each other as opposed to absolute elevation.

The corresponding structures, materials, acts, and equivalents of any means or step-plus-function elements in the claims below are intended to include any structure, material, or act for performing the function in combination with other claimed elements as specifically claimed. The description of the various embodiments has been presented for purposes of illustration and description, but is not intended to be exhaustive or limited to the forms disclosed. Many modifications and variations will be apparent to those of ordinary skill in the art without departing from the scope and spirit thereof. The embodiments were chosen and described in order to best explain principles and practical applications, and to enable others of ordinary skill in the art to understand the various embodiments with various modifications as are suited to the particular use contemplated.

The abstract is provided to comply with 37 C.F.R. § 1.72(b), which requires an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the appended claims reflect, the claimed subject matter may lie in less than all features of a single embodiment. Thus the following claims are hereby incorporated into the Detailed Description, with each claim standing on its own as separately claimed subject matter.

Given the teachings provided herein, one of ordinary skill in the art will be able to contemplate other implementations and applications of the techniques and disclosed embodiments. Although illustrative embodiments have been described herein with reference to the accompanying drawings, it is to be understood that illustrative embodiments are not limited to those precise embodiments, and that various other changes and modifications are made therein by one skilled in the art without departing from the scope of the appended claims.

What is claimed is:

1. A classifier system implementing a deep neural network (DNN), the classifier
    system comprising:
    a weight block;
    a classification block;
    a row selector; and
    a sensor array operatively coupled with the weight block, the classification block and the row selector, the sensor array comprising a plurality of sensor cells corresponding to respective neurons in an input layer of the DNN, the plurality of sensor cells arranged in a two-dimensional matrix configuration, row lines, column lines, a data integration line and an integration start line;
    wherein the classifier system is configured such that the plurality of sensor cells share a common terminal connected to the data integration line, the row lines are controlled by the row selector,
    and the column lines receive respective weight values from the weight block, the weight values received from the weight block corresponding to connection weights in the DNN,
    wherein the classification block includes a first integrator receiving a signal generated on the data integration line when the integration start line is selected, and a first thresholding unit receiving a signal from the first integrator, the first thresholding unit operatively coupled to an array of second integrators and second thresholding units arranged in a two-dimensional matrix configuration, the array of second integrators and second thresholding units including row lines, controlled by the row selector, and column lines receiving respective weight values from the weight block, and
    wherein the sensor array comprises a plurality of storage capacitors, a first plurality of select transistors and a second plurality of select transistors, and wherein a gate terminal of each of the first plurality of select transistors in each row is controlled by a corresponding one of the row lines connected to the row selector, a first source/drain terminal of each of the first plurality of select transistors in each column receives a weight value from a corresponding one of the column lines connected to the weight block, a second source/drain terminal of each of the first plurality of select transistors is connected to a corresponding one of the storage capacitors and to a first source/drain terminal of each of the second plurality of select transistors, a gate terminal of each of the second plurality of select transistors is connected to the integration start line, a second source/drain terminal of each of the second plurality of select transistors is connected to a first terminal of each of a corresponding one of the plurality of sensor cells, and a second terminal of each of the plurality of sensor cells is connected to the data integration line.

2. The system of claim 1, wherein the column lines used in the sensor array are the same as the column lines used in the classification block.

3. The system of claim 1, wherein an integration time of the classification block is configured to be shorter than resistance-capacitance (RC) delays associated with sensor resistance values and storage capacitance values.

4. The system of claim 1, wherein voltages loaded by the weight block onto the column lines in the sensor array are associated with the connection weights of the input layer of the DNN.

5. The system of claim 1, wherein voltages loaded by the weight block onto the column lines in the classification block are associated with weights of at least one of a hidden layer of the DNN and the output layer of the DNN.

6. The system of claim 1, wherein the sensor array is scanned HI times for each classification, where HI is an integer indicative of a number of neurons in a first hidden layer of the DNN.

7. The system of claim 1, wherein each of at least a subset of at least one of the first and second select transistors comprises a thin-film transistor.

8. The system of claim 1, wherein each of at least a subset of at least one of the first and second select transistors comprises a heterojunction field effect transistor comprised of hydrogenated amorphous silicon contacts on single-crystalline or poly-crystalline silicon.

9. The system of claim 1, wherein each of at least a subset of sensor cells comprises a two-terminal hydrogenated amorphous silicon photoconductor.

10. The system of claim 1, wherein the weight block comprises a cross-bar array of programmable resistive elements.

11. The system of claim 1, wherein the first thresholding unit and the second thresholding units are configured to implement a sigmoid activation function.

12. The system of claim 1, wherein at least one of the first and second integrators in the classification block comprises an operational amplifier and a capacitor, the capacitor connected between an input and an output of the operational amplifier.

13. A classifier system implementing a deep neural network (DNN), the classifier system comprising:
    a weight block;
    a classification block;
    a row selector; and a sensor array operatively coupled with the weight block, the classification block and the row selector, the sensor array comprising a plurality of sensor cells corresponding to respective neurons in an input layer of the DNN, the plurality of sensor cells arranged in a two-dimensional matrix configuration, row lines, column lines, a data integration line and an integration start line;

wherein the classifier system is configured such that the plurality of sensor cells share a common terminal connected to the data integration line, the row lines are controlled by the row selector, and the column lines receive respective weight values from the weight block, the weight values received from the weight block corresponding to connection weights in the DNN, and wherein the classification block includes a first integrator receiving a signal generated on the data integration line when the integration start line is selected, and a first thresholding unit receiving a signal from the first integrator, the first thresholding unit operatively coupled to an array of second integrators and second thresholding units arranged in a two-dimensional matrix configuration, the array of second integrators and second thresholding units including row lines, controlled by the row selector, and column lines receiving respective weight values from the weight block, and wherein the array of the second integrators and second thresholding units in the classification block is further described in that the second integrators in the first row of the array receive signals from the first thresholding unit and receive weight values from the column lines, the second integrators in a given row except the first row receive signals from the second thresholding units in the previous row and receive weight values from the column lines, the second thresholding units in a given row receive signals from the second integrators in the same row, the second thresholding units in a given row except the last row provide signals to the second integrators in the next row, and the second thresholding units in the last row provide signals to an output circuit.

14. The system of claim 13, wherein the column lines used in the sensor array are the same as the column lines used in the classification block.

15. The system of claim 13, wherein an integration time of the classification block is configured to be shorter than resistance-capacitance (RC) delays associated with sensor resistance values and storage capacitance values.

16. The system of claim 13, wherein voltages loaded by the weight block onto the column lines in the sensor array are associated with the connection weights of the input layer of the DNN.

17. The system of claim 13, wherein voltages loaded by the weight block onto the column lines in the classification block are associated with weights of at least one of a hidden layer of the DNN and the output layer of the DNN.

18. The system of claim 13, wherein the sensor array is scanned HI times for each classification, where HI is an integer indicative of a number of neurons in a first hidden layer of the DNN.

19. The system of claim 13, wherein each of at least a subset of at least one of the first and second select transistors comprises a thin-film transistor.

20. The system of claim 13, wherein each of at least a subset of at least one of the first and second select transistors comprises a heterojunction field effect transistor comprised of hydrogenated amorphous silicon contacts on single-crystalline or poly-crystalline silicon.

21. The system of claim 13, wherein each of at least a subset of sensor cells comprises a two-terminal hydrogenated amorphous silicon photoconductor.

22. The system of claim 13, wherein the weight block comprises a cross-bar array of programmable resistive elements.

23. The system of claim 13, wherein the first thresholding unit and the second thresholding units are configured to implement a sigmoid activation function.

24. The system of claim 13, wherein at least one of the first and second integrators in the classification block comprises an operational amplifier and a capacitor, the capacitor connected between an input and an output of the operational amplifier.

\* \* \* \* \*